(12) United States Patent
Kondo et al.

(10) Patent No.: US 11,050,217 B2
(45) Date of Patent: *Jun. 29, 2021

(54) LIGHT-EMITTING DEVICE, OPTICAL APPARATUS, OPTICAL MEASUREMENT APPARATUS, AND IMAGE FORMING APPARATUS

(71) Applicant: FUJIFILM Business Innovation Corp., Tokyo (JP)

(72) Inventors: Takashi Kondo, Kanagawa (JP); Tsutomu Otsuka, Kanagawa (JP); Takeshi Minamiru, Kanagawa (JP); Kazuhiro Sakai, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/546,305

(22) Filed: Aug. 21, 2019

(65) Prior Publication Data
US 2020/0244039 A1 Jul. 30, 2020

(30) Foreign Application Priority Data
Jan. 25, 2019 (JP) .............................. JP2019-010749

(51) Int. Cl.
| | |
|---|---|
| *G09G 5/02* | (2006.01) |
| *H01S 5/042* | (2006.01) |
| *H01S 5/062* | (2006.01) |
| *G01S 7/481* | (2006.01) |
| *H04N 9/31* | (2006.01) |
| *H01S 5/42* | (2006.01) |
| *H01S 5/30* | (2006.01) |
| *H01S 5/026* | (2006.01) |
| *G01S 17/10* | (2020.01) |

(52) U.S. Cl.
CPC .......... *H01S 5/0428* (2013.01); *G01S 7/4815* (2013.01); *G01S 17/10* (2013.01); *H01S 5/0261* (2013.01); *H01S 5/062* (2013.01); *H01S 5/3095* (2013.01); *H01S 5/426* (2013.01); *H04N 9/3135* (2013.01)

(58) Field of Classification Search
CPC ...... G01S 17/10; G01S 7/4815; H01S 5/0261; H01S 5/0428; H01S 5/062; H01S 5/3095; H01S 5/426; H04N 9/3135
See application file for complete search history.

(56) References Cited

U.S. PATENT DOCUMENTS

| 7,948,004 B2 | 5/2011 | Suzuki |
| 2018/0062041 A1* | 3/2018 | Nakanishi .............. H04N 1/036 |

FOREIGN PATENT DOCUMENTS

| JP | H01238962 | 9/1989 |
| JP | 2001308385 | 11/2001 |
| JP | 2009286048 | 12/2009 |

* cited by examiner

*Primary Examiner* — Insa Sadio
(74) *Attorney, Agent, or Firm* — JCIPRNET

(57) ABSTRACT

A light-emitting device includes a light-emitting unit. The light-emitting unit includes an array of multiple light-emitting element groups, each including multiple light-emitting elements. In the light-emitting unit, the multiple light-emitting element groups are sequentially driven along the array such that, for each of the multiple light-emitting element groups, the multiple light-emitting elements included in the light-emitting element group are concurrently set to a state of emitting light or a state of not emitting light.

13 Claims, 17 Drawing Sheets

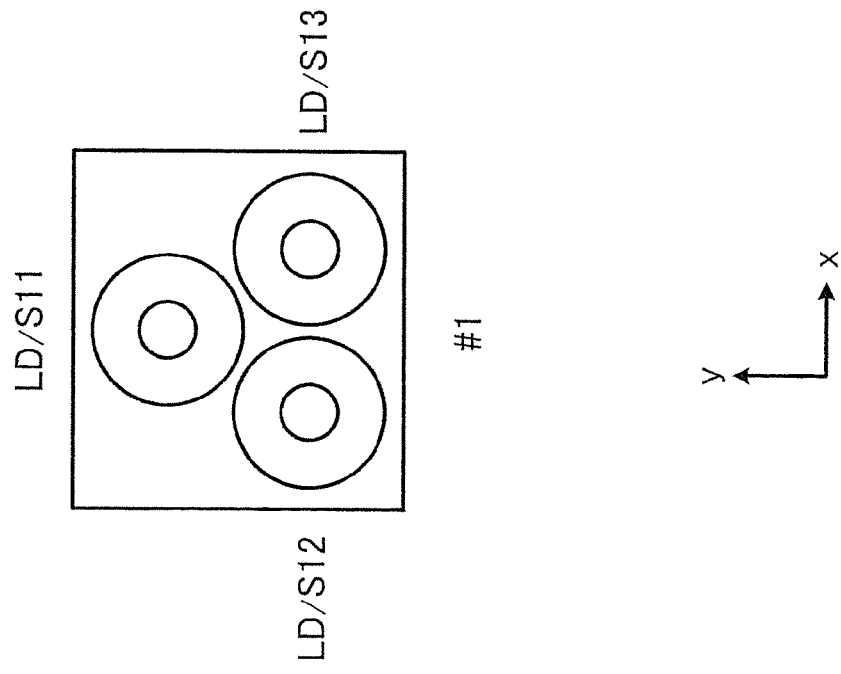
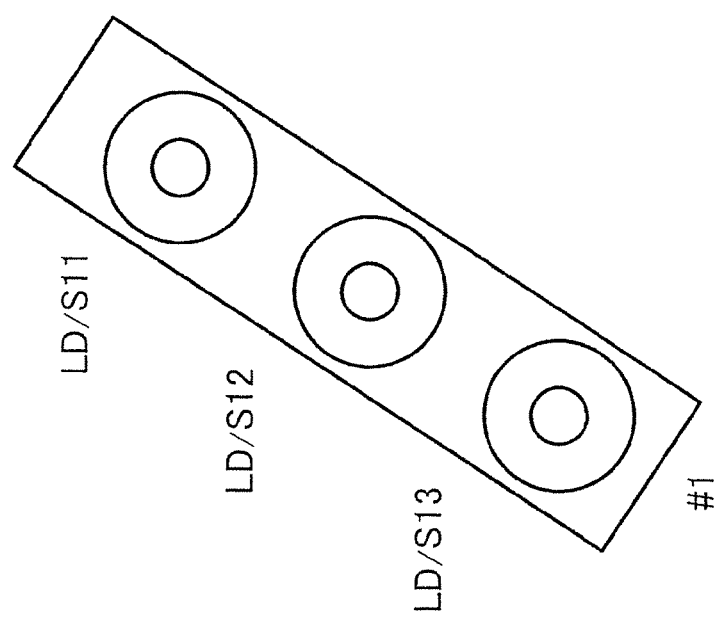
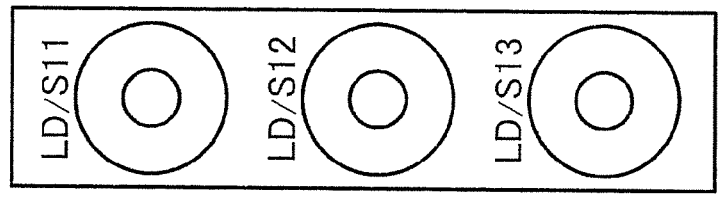

LIGHT-EMITTING DEVICE, OPTICAL APPARATUS, OPTICAL MEASUREMENT APPARATUS, AND IMAGE FORMING APPARATUS

CROSS-REFERENCE TO RELATED APPLICATIONS

This application is based on and claims priority under 35 USC 119 from Japanese Patent Application No. 2019-010749 filed Jan. 25, 2019.

BACKGROUND

(i) Technical Field

The present disclosure relates to a light-emitting device, an optical apparatus, an optical measurement apparatus, and an image forming apparatus.

(ii) Related Art

Japanese Unexamined Patent Application Publication No. 01-238962 describes a light-emitting element array. The light-emitting element array is configured such that a large number of light-emitting elements for which a threshold voltage or threshold current is controllable by light from the outside are arranged one-dimensionally, two-dimensionally, or three-dimensionally and at least a portion of light generated from each of the light-emitting elements is incident on another nearby light-emitting element. The light-emitting elements are connected to clock lines to apply voltage or current from the outside.

Japanese Unexamined Patent Application Publication No. 2001-308385 describes a self-scanning light-emitting device. The self-scanning light-emitting device includes light-emitting elements a pnpnpn sixth-layer semiconductor structure such that the p-type first layer and the n-type sixth layer on both ends and the p-type third layer and the n-type fourth layer at the center are provided with electrodes to allow the pn layers to implement a light-emitting diode function and the pnpn four layers to implement a thyristor function.

Japanese Unexamined Patent Application Publication No. 2009-286048 describes a self-scanning light source head. The self-scanning light source head includes a substrate, surface emitting semiconductor lasers arranged in an array on the substrate, and a thyristor serving as a switching element arranged on the substrate and configured to selectively turn on and off light emission of the surface emitting semiconductor lasers.

SUMMARY

In a light-emitting device in which arranged light-emitting elements are set to a turn-on state or a turn-off state in order of arrangement to emit light, it is conceivable to increase the sizes of light-emitting points of the light-emitting elements to address insufficient optical output from the light-emitting device. However, increasing the sizes of the light-emitting points of the light-emitting elements may result in impaired uniformity of light emission or, when the light-emitting elements perform laser oscillation, due to the generation of a higher-order mode, cause deterioration of the light emission characteristics of the light-emitting elements, such as distorted light-emission profiles or increased divergence angles.

Aspects of non-limiting embodiments of the present disclosure relate to a light-emitting device, an optical apparatus, an optical measurement apparatus, and an image forming apparatus that can provide increased optical output without deterioration of light emission characteristics which may be caused by increasing the sizes of light-emitting points of light-emitting elements.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light-emitting device including a light-emitting unit. The light-emitting unit includes an array of a plurality of light-emitting element groups, each including a plurality of light-emitting elements. In the light-emitting unit, the plurality of light-emitting element groups are sequentially driven along the array such that, for each of the plurality of light-emitting element groups, the plurality of light-emitting elements included in the light-emitting element group are concurrently set to a state of emitting light or a state of not emitting light.

BRIEF DESCRIPTION OF THE DRAWINGS

Exemplary embodiments of the present disclosure will be described in detail based on the following figures, wherein:

FIGS. 5A to 5C illustrate the operation of thyristors, in which FIG. 5A is a cross-sectional view of a thyristor including no voltage reduction layer, FIG. 5B is a cross-sectional view of a thyristor including a voltage reduction layer, and FIG. 5C illustrates characteristics of the thyristors;

FIGS. 7A to 7C illustrate the multi-layer structure of a setting thyristor and a laser diode, in which FIG. 7A is a schematic energy band diagram of the multi-layer structure of the setting thyristor and the laser diode, FIG. 7B is an energy band diagram of a tunnel junction layer in reverse bias, and FIG. 7C illustrates a current-voltage characteristic of the tunnel junction layer;

FIGS. 9A to 9C illustrate arrangements of laser diodes included in a laser diode group, in which FIG. 9A illustrates a y-direction arrangement of the laser diodes, FIG. 9B illustrates a diagonal arrangement of the laser diodes relative to the x direction and the y direction, and FIG. 9C illustrates a triangular arrangement of the laser diodes;

DETAILED DESCRIPTION

The following describes exemplary embodiments of the present disclosure in detail with reference to the accompanying drawings.

First Exemplary Embodiment

Light-Emitting Device 10

Figure 1:
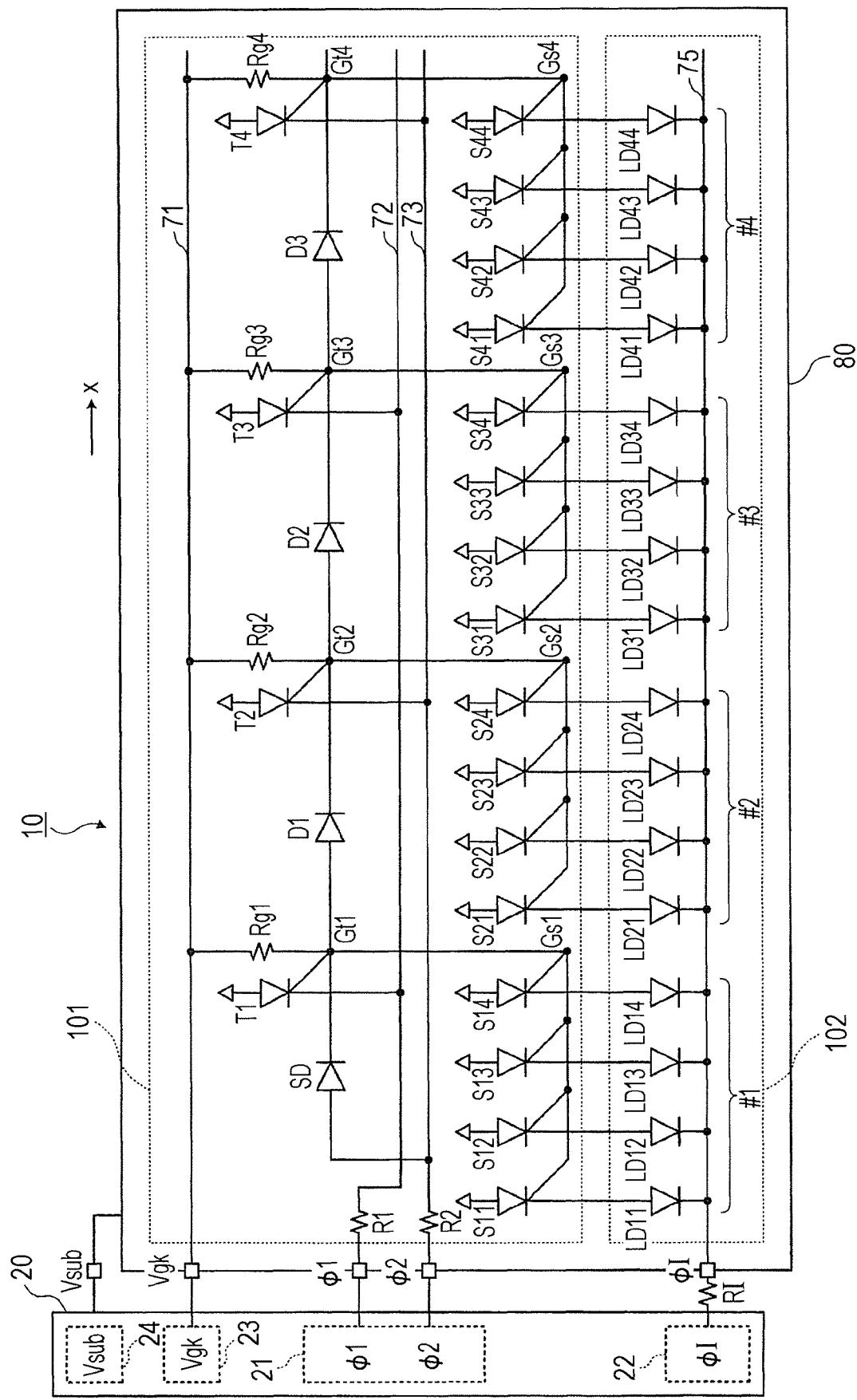
FIG. 1 is an equivalent circuit diagram of a light-emitting device according to a first exemplary embodiment.

FIG. 1 is an equivalent circuit diagram of a light-emitting device 10 according to a first exemplary embodiment. A control unit 20 that controls the light-emitting device 10 is also illustrated in FIG. 1. In FIG. 1, a direction extending rightward is defined as the x direction.

The light-emitting device 10 includes a plurality of laser diodes LD that emit beams of laser light. Each of the laser diodes LD is an example of a light-emitting element. As described below, the light-emitting device 10 is configured as a self-scanning light-emitting element array (self-scanning light emitting device (SLED)). The laser diodes LD are vertical cavity surface emitting laser (VCSEL) diodes, for example. In the following, light-emitting elements are described as laser diodes LD. Alternatively, light-emitting elements may be other light-emitting devices such as light-emitting diodes (LEDs).

The light-emitting device 10 includes a plurality of laser diode LD groups, each including a plurality of laser diodes LD. In FIG. 1, each laser diode LD group includes four laser diodes LD, by way of example. In the following, the laser diode LD groups are represented as laser diode LD groups #1, #2, #3, etc. or simply as #1, #2, #3, etc. The laser diode LD groups that are not distinguished from each other are represented as the laser diode LD groups or as the laser diode LD groups i (i is an integer greater than or equal to 1). While four laser diode LD groups are illustrated in FIG. 1, the number of laser diode LD groups may be other than four.

Each of the laser diode LD groups is an example of a light-emitting element group. The laser diode LD groups may be sometimes represented as laser diode groups.

The light-emitting device 10 includes a setting thyristor S for each of the laser diodes LD. Each of the laser diodes LD and the corresponding one of the setting thyristors S are connected in series.

Here, the laser diodes LD included in the laser diode LD group #1 are represented as laser diodes LD11 to LD14, and the laser diodes LD included in the laser diode LD group #2 are represented as laser diodes LD21 to LD24. In a laser diode LDij (j is an integer greater than or equal to 2), "i" denotes the number of a laser diode LD group and "j" denotes the number of a laser diode LD in the laser diode LD group. The setting thyristors S are also assigned numerals in a similar way. That is, the setting thyristor S provided for the laser diode LD11 is represented as a setting thyristor S11. In the example illustrated in FIG. 1, j ranges from 1 to 4. In the following, a description will be made, assuming that j ranges from 1 to 4. In FIG. 1, each of the laser diode LD groups includes the same number of laser diodes LD. However, each of the laser diode LD groups may include a different number of laser diodes LD. The number (j) of laser diodes LD in each of the laser diode LD groups may be two or more.

As used herein, the term "A to B", where A and B are numbers, is used to indicate a plurality of elements that are individually identified with numbers ranging from A to B, both inclusive. For example, the laser diodes LD11 to LD14 include the laser diode LD11, the laser diode LD12, the laser diode LD13, and the laser diode LD14.

The light-emitting device 10 further includes a plurality of transfer thyristors T, a plurality of coupling diodes D, a plurality of power supply line resistors Rg, a start diode SD, and current-limit resistors R1 and R2. To distinguish the plurality of transfer thyristors T from each other, the plurality of transfer thyristors T are assigned numbers, such as transfer thyristors T1, T2, and T3. The same applies to the coupling diodes D and the power supply line resistors Rg. As described below, the transfer thyristor T1 is disposed so as to be associated with the laser diode LD group #1. Thus, a transfer thyristor Ti is associated with the laser diode LD group assigned the number i. Thus, a transfer thyristor Ti is sometimes used. The same applies to the coupling diodes D and the power supply line resistors Rg.

The number of transfer thyristors T in the light-emitting device 10 may be determined in advance. For example, 128 transfer thyristors T, 512 transfer thyristors T, or 1024 transfer thyristors T may be used. In FIG. 1, a portion corresponding to the transfer thyristors T1 to T4 is illustrated. The number of transfer thyristors T may be the same as the number (i) of laser diode LD groups. It should be noted that the number of transfer thyristors T may exceed or be less than the number (i) of laser diode LD groups.

The transfer thyristors T are arranged in the x direction in the order of the transfer thyristors T1, T2, T3, etc. The coupling diodes D are arranged in the x direction in the order of the coupling diodes D1, D2, D3, etc. The coupling diode D1 is disposed between the transfer thyristor T1 and the transfer thyristor T2. The same applies to the other coupling diodes D. The power supply line resistors Rg are also arranged in the x direction in the order of the power supply line resistors Rg1, Rg2, Rg3, etc.

The laser diodes LD and the coupling diodes D are two-terminal elements each including an anode and a cathode. The setting thyristors S and the transfer thyristors T are three-terminal elements each including an anode, a cathode, and a gate. The gate of each of the transfer thyristors T is represented as gate Gt, and the gate of each of the setting thyristors S is represented as gate Gs. To distinguish them from each other, they are assigned the sign "i" in a way similar to that described above.

A portion constituted by the laser diodes LD is referred to as a light-emitting unit 102, and a portion constituted by the setting thyristors S, the transfer thyristors T, the coupling diodes D, the start diode SD, the power supply line resistors Rg, and the current-limit resistors R1 and R2 is referred to as a transfer unit 101. Each of the setting thyristors S is an example of a setting element, and each of the transfer thyristors T is an example of a transfer element.

Next, the connections of the elements (such as the laser diodes LD, the setting thyristors S, and the transfer thyristors T) will be described.

As described above, each of the laser diodes LDij and each of the setting thyristors Sij are connected in series. That is, the anodes of the setting thyristors Sij are connected to a reference potential Vsub (such as ground potential (GND)), and the cathodes of the setting thyristors Sij are connected to the anodes of the laser diodes LDij. The gates of setting thyristors Sij with the same number i are connected in parallel and are represented as a gate Gsi. The cathodes of the laser diodes LDij are connected in common to a turn-on signal line 75 that provides a turn-on signal $\phi$I to control each of the laser diodes LD to the state of emitting light or the state of not emitting light.

As described below, the reference potential Vsub is supplied through a back-surface electrode 92 (see FIGS. 3 and 4, described below) disposed on the back surface of a substrate 80 that forms the light-emitting device 10.

The anodes of the transfer thyristors T are connected to the reference potential Vsub. The cathodes of the odd numbered transfer thyristors T1, T3, etc., are connected to a transfer signal line 72. The transfer signal line 72 is connected to a $\phi$1 terminal via the current-limit resistor R1.

The cathodes of the even numbered transfer thyristors T2, T4, etc. are connected to a transfer signal line 73. The transfer signal line 73 is connected to a $\phi$2 terminal via the current-limit resistor R2.

The coupling diodes D are connected in series. That is, the cathode of one of the coupling diodes D is connected to the anode of the coupling diode D adjacent thereto in the x direction. The anode of the start diode SD is connected to the transfer signal line 73, and the cathode of the start diode SD is connected to the anode of the coupling diode D1.

The cathode of the start diode SD and the anode of the coupling diode D1 are connected to the gate Gt1 of the transfer thyristor T1. The cathode of the coupling diode D1 and the anode of the coupling diode D2 are connected to the gate Gt2 of the transfer thyristor T2. The same applies to the other coupling diodes D.

The gates Gt of the transfer thyristors T are connected to a power supply line 71 via the power supply line resistors Rg. The power supply line 71 is connected to a Vgk terminal.

The gate Gti of the transfer thyristor Ti is connected to the gate Gsi of the setting thyristors Sij.

The configuration of the control unit 20 will be described.

The control unit 20 generates a signal such as the turn-on signal $\phi$I and supplies the generated signal to the light-emitting device 10. The light-emitting device 10 operates in accordance with the supplied signal. The control unit 20 is constituted by an electronic circuit. For example, the control unit 20 may be an integrated circuit (IC) configured to drive the light-emitting device 10.

The control unit 20 includes a transfer signal generation unit 21, a turn-on signal generation unit 22, a power supply potential generation unit 23, and a reference potential generation unit 24.

The transfer signal generation unit 21 generates transfer signals $\phi$1 and $\phi$2, and supplies the transfer signal $\phi$1 to the $\phi$1 terminal of the light-emitting device 10 and the transfer signal $\phi$2 to the $\phi$2 terminal of the light-emitting device 10.

The turn-on signal generation unit 22 generates the turn-on signal $\phi$I, and supplies the turn-on signal $\phi$I to a $\phi$I terminal of the light-emitting device 10 via the current-limit resistor RI. The current-limit resistor RI may be disposed in the light-emitting device 10. If the current-limit resistor RI is not required for the operation of the light-emitting device 10, the current-limit resistor RI may not necessarily be disposed.

The power supply potential generation unit 23 generates a power supply potential Vgk, and supplies the power supply potential Vgk to the Vgk terminal of the light-emitting device 10. The reference potential generation unit 24 generates the reference potential Vsub, and supplies the reference potential Vsub to a Vsub terminal of the light-emitting device 10. The power supply potential Vgk is −3.3 V, by way of example. The reference potential Vsub is ground potential (GND), by way of example, as described above.

The transfer signals $\phi$1 and $\phi$2 generated by the transfer signal generation unit 21 and the turn-on signal $\phi$1 generated by the turn-on signal generation unit 22 will be described below.

In the light-emitting device 10 illustrated in FIG. 1, four laser diodes LDij (j=1 to 4) are connected to each of transfer thyristors Ti via the respective setting thyristors Sij.

As described below, each of the transfer thyristors Ti is turned on, thereby setting the setting thyristors Sij connected to the transfer thyristor Ti so as to be capable of entering an on-state. The transfer thyristors Ti are driven so as to be turned on one after another. Thus, the transfer thyristors Ti are represented as transfer thyristors T. The setting thyristors Sij are turned on, thereby allowing the laser diodes LDij to emit light. Thus, the setting thyristors Sij, which set the laser diodes LD to the state of being capable of emitting light, are represented as setting thyristors S.

Here, a plurality of laser diodes LD constitute each of the laser diode LD groups. Each of the transfer thyristors T is connected to one of the laser diode LD groups, and the laser diodes LD included in the laser diode LD group emit light concurrently.

It is desirable that the laser diodes LD oscillate in a low-order single transverse mode (single mode). In the single mode, light (exit light) exiting from a light-emitting point (a light exit opening 310 illustrated in FIGS. 3 and 4, described below) of each of the laser diodes LD has an intensity profile with a single peak (a characteristic having a single intensity peak). On the other hand, in the laser diodes LD that oscillate in multiple transverse modes including higher-order multiple transverse modes (multimode), the intensity profiles are likely to be distorted such as exhibiting a plurality of peaks. In the single mode, furthermore, the divergence angle of light (exit light) exiting from a light-emitting point is smaller than that in the multimode. Accordingly, for the same optical output, the optical density at an irradiated surface is larger in the single mode than in the multimode. The divergence angle is defined as the full width at half maximum (FWHM) of light emitted from the laser diodes LD.

The smaller the area of the light-emitting point, the more likely the laser diode LD is to oscillate in the single transverse mode (single mode). Thus, the optical output of the laser diode LD in the single mode is small. If the area of the light-emitting point is increased to increase the optical output, as described above, a transition to the multimode occurs. In the first exemplary embodiment, thus, a plurality of laser diodes LD constitute a laser diode LD group, and the plurality of laser diodes LD included in the laser diode LD group are allowed to emit light concurrently to increase the optical output.

Plan View Layout of Light-Emitting Device 10

Figure 2:
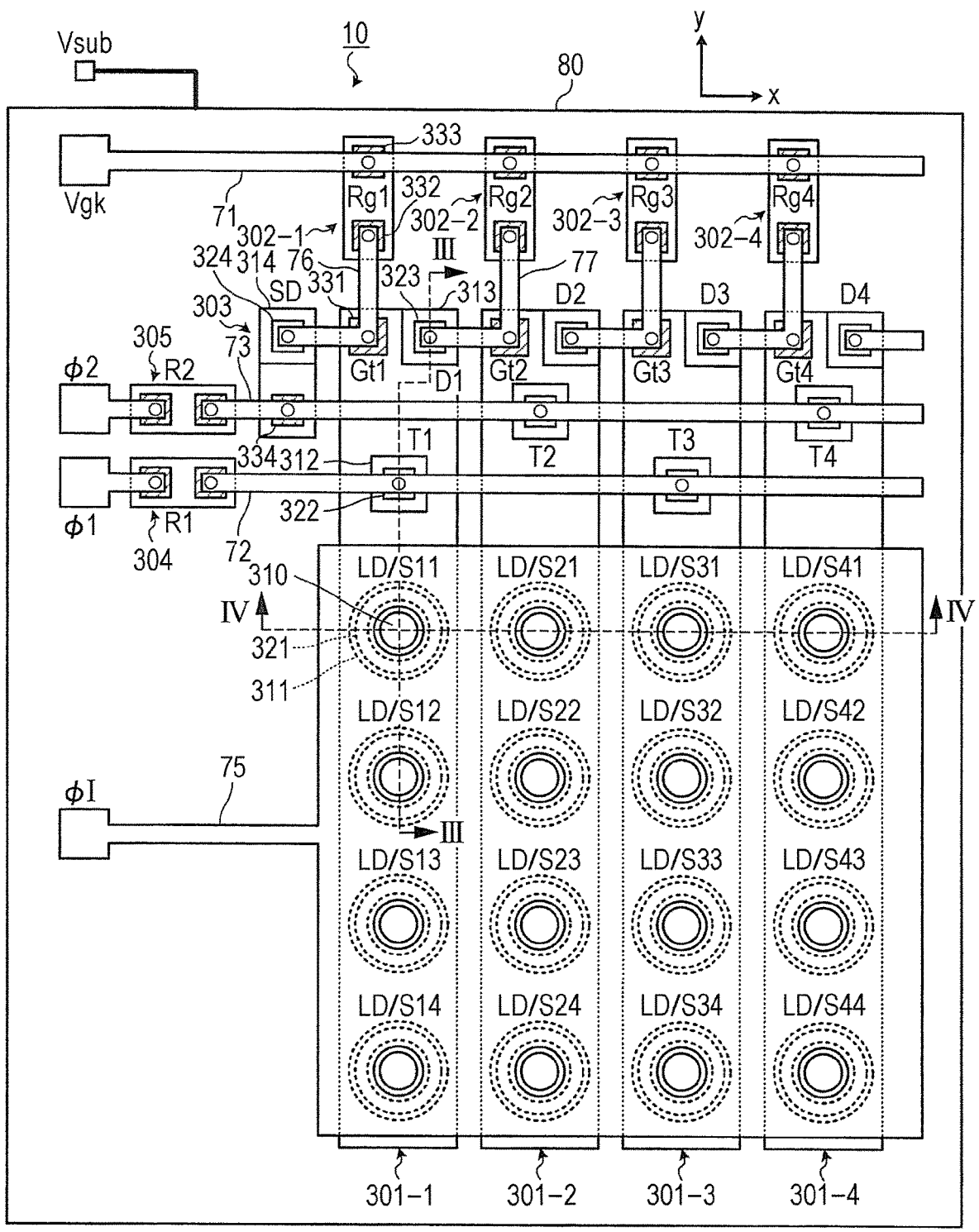
FIG. 2 illustrates an example of a plan view layout of the light-emitting device according to the first exemplary embodiment.

FIG. 2 illustrates an example of a plan view layout of the light-emitting device 10 according to the first exemplary embodiment. In FIG. 2, a direction extending rightward is defined as the x direction, and a direction extending upward is defined as the y direction. The x direction is the same direction as the x direction in FIG. 1.

The light-emitting device 10 is formed of a semiconductor material that allows a beam of laser light to be emitted. For example, the light-emitting device 10 is formed of a GaAs-based compound semiconductor. As illustrated in sectional views described below (see FIGS. 3 and 4, described below), the light-emitting device 10 is constituted by a multi-layer semiconductor body formed by stacking a plurality of GaAs-based compound semiconductor layers on top of each other on a p-type GaAs substrate 80. Then, the multi-layer semiconductor body is separated into a plurality of island-shaped portions, thereby forming the light-emitting device 10. The island-shaped areas are referred to as islands. Etching the multi-layer semiconductor body into island-shaped portions to obtain separate elements is referred to as mesa etching. The plan view layout of the light-emitting device 10 will be described using islands 301, 304, and 305 illustrated in FIG. 2. To distinguish islands 301 and 302 from each other, the islands 301 and 302 are represented as 301-$i$ and 302-$i$, respectively, in a way similar to that described above ($i \geq 1$).

Each of the islands 301-$i$ is provided with the laser diodes LDij, the setting thyristors Sij, the transfer thyristor Ti, and the coupling diode Di (in the illustrated example, j=1 to 4). Each of the laser diodes LDij and the corresponding one of the setting thyristors Sij are stacked on top of each other. In FIG. 2, the laser diodes LDij and the setting thyristors Sij are represented as LD/Sij.

The islands 301-$i$ are disposed in parallel in the x direction. Here, the laser diode LD groups are arranged one-dimensionally in the x direction.

Each of the islands 302-$i$ is provided with the power supply line resistor Rgi. The islands 302-$i$ are disposed in parallel in the x direction.

The island 303 is provided with the start diode SD. The island 304 is provided with the current-limit resistor R1, and the island 305 is provided with the current-limit resistor R2.

Cross-Sectional Structure of Light-Emitting Device 10

Next, prior to the description of connections among the islands 301, 302, 303, 304, and 305, the cross-sectional structure of the islands 301 will be described.

Figure 3:
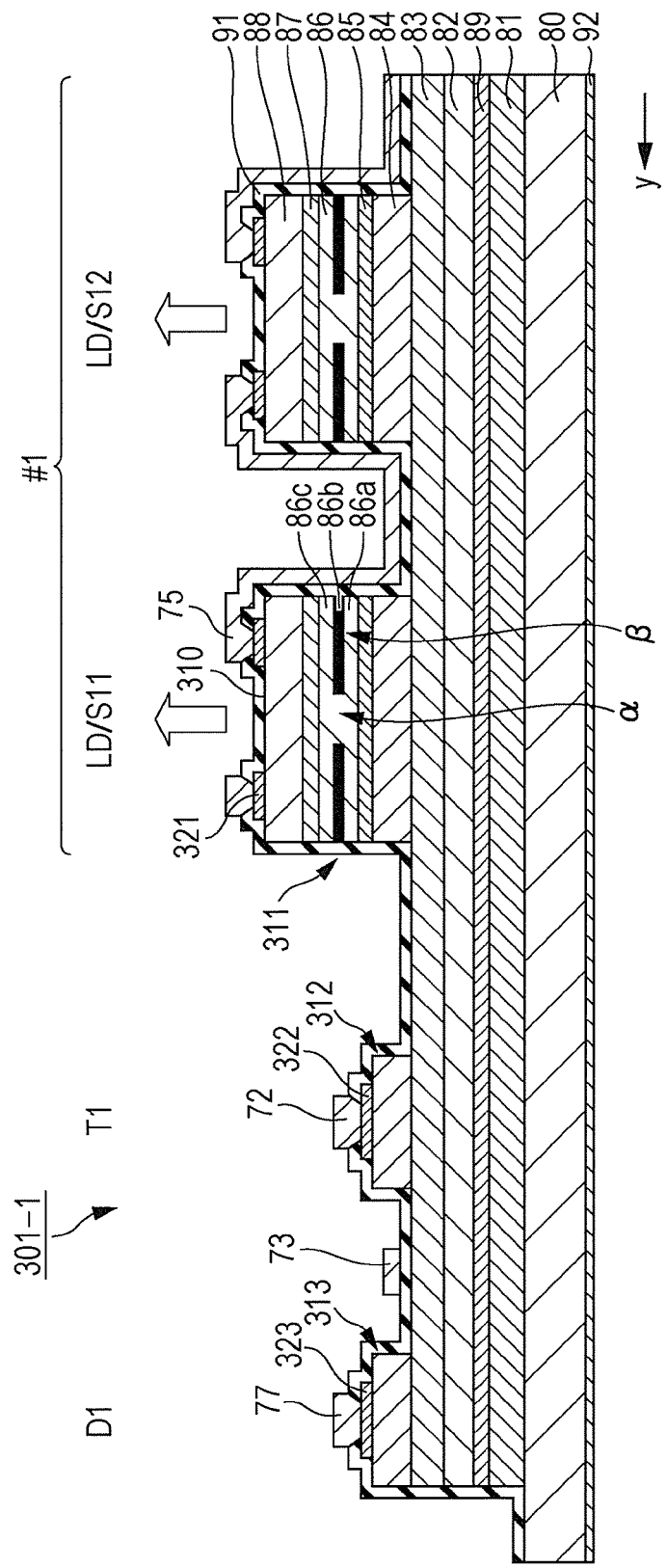
FIG. 3 is a cross-sectional view of the light-emitting device, taken along line of FIG. 2.

FIG. 3 is a cross-sectional view of the light-emitting device 10, taken along line III-III of FIG. 2. In FIG. 3, a direction extending leftward is defined as the y direction. The cross-sectional view illustrated in FIG. 3 is a cross-sectional view of the island 301-1. In FIG. 3, the coupling diode D1, the transfer thyristor T1, the laser diode LD11/setting thyristor S11 (LD/S11), and the laser diode LD12/setting thyristor S12 (LD/S12) are illustrated from the left to the right. The laser diode LD13/setting thyristor S13 (LD/S13) and the laser diode LD14/setting thyristor S14 (LD/S14) are disposed to the right of the laser diode LD12/setting thyristor S12 (LD/S12), which are not illustrated in FIG. 3.

First, a portion where a setting thyristor S and a laser diode LD are stacked on top of each other (such as LD/S11 or LD/S12) will be described. As illustrated in FIG. 3, on the p-type GaAs substrate 80, layers forming the setting thyristor S are stacked on top of each other, which include a p-type anode layer (hereinafter referred to as a p-anode layer; the same applies to the other layers) 81, a voltage reduction layer 89, an n-type gate layer (n-gate layer) 82, a p-type gate layer (p-gate layer) 83, and an n-type cathode layer (n-cathode layer) 84. That is, the setting thyristor S is formed by stacking the p-anode layer 81 as an anode, the n-gate layer 82 as an n-gate, the p-gate layer 83 as a p-gate, and the n-cathode layer 84 as a cathode on top of each other.

Then, a tunnel junction layer 85 is stacked on top of the n-cathode layer 84.

On top of the tunnel junction layer 85, layers forming the laser diodes LD are stacked on top of each other, which include a p-type anode layer (p-anode layer) 86, a light-emitting layer 87, and an n-type cathode layer (n-cathode layer) 88. That is, the laser diode LD is formed by stacking the p-anode layer 86 as an anode, the light-emitting layer 87 as a light-emitting layer, and the n-cathode layer 88 as a cathode on top of each other.

The setting thyristor S and the laser diode LD are connected in series via the tunnel junction layer 85. The tunnel junction layer 85 and the voltage reduction layer 89 will be described below.

The n-gate layer 82 is an example of a first gate layer, and the p-gate layer 83 is an example of a second gate layer.

The laser diode LD11/setting thyristor S11 (LD/S11) will be described as an example of the laser diode LD/setting thyristor S, with numerals assigned, whereas the other laser diodes LD/setting thyristors S are similar and are not assigned numerals.

In a portion where the laser diode LD and the setting thyristor S are stacked on top of each other, the n-cathode layer 88, the light-emitting layer 87, the p-anode layer 86, the tunnel junction layer 85, and the n-cathode layer 84 are removed by etching so as to expose the p-gate layer 83 around the laser diode LD. Here, the laser diode LD has a circular cross-section. That is, the portion of the laser diode LD is formed into a cylindrical shape. Thus, the portion of the laser diode LD is represented as a post 311 (see FIG. 2).

In the post 311, an n-ohmic electrode 321, which is formed of a metal material that facilitates the establishment of ohmic contact with an n-type semiconductor layer such as the n-cathode layer 88, is disposed on top of the n-cathode layer 88 of the laser diode LD. The n-ohmic electrode 321 is formed into a circular shape so as to surround the light exit opening 310. Further, an interlayer insulating layer 91 is disposed so as to cover a surface of the n-ohmic electrode 321. On top of the interlayer insulating layer 91, the turn-on signal line 75 is disposed so as to be connected to the n-ohmic electrode 321 via a through-hole formed in the interlayer insulating layer 91. When the interlayer insulating layer 91 is less likely to transmit exit light from the laser diode LD, a light exit layer that is more likely to transmit exit light from the laser diode LD may be disposed over the light exit opening 310 instead of the interlayer insulating layer 91.

The interlayer insulating layer 91 is disposed so as to cover the entirety of the light-emitting device 10.

The p-anode layer 81, the voltage reduction layer 89, the n-gate layer 82, and the p-gate layer 83, which form the setting thyristor S, are continuous across the laser diodes LD (the laser diodes LD11 to LD14) included in the laser diode LD group #1.

In the post 311, the p-anode layer 86 includes a current constriction layer 86b. By way of example, the p-anode layer 86 is constituted by three layers, namely, a lower p-anode layer 86a, the current constriction layer 86b, and an upper p-anode layer 86c. The current constriction layer 86b is formed of a material having a high Al composition ratio, such as AlAs, and is a layer in which Al is oxidized to $Al_2O_3$, which increases electrical resistance, resulting in the formation of a portion where current is less likely to flow (a solid-black portion in FIG. 3).

Since the post 311 is formed into a cylindrical shape, if the current constriction layer 86b is oxidized from the exposed side surfaces of the p-anode layer 86, oxidation progresses from a circumferential portion of the circular cross section toward a center portion. The center portion is not oxidized, resulting in the center portion of the cross section of the laser diode LD being a current-passing area α, where current is likely to flow, and the circumferential portion being a current-blocking area β, where current is less likely to flow. In the laser diode LD, light emission is generated in a portion having a constricted current path in the current-passing area α of the light-emitting layer 87. An area on the surface of the laser diode LD corresponding to the current-passing area α is represented sometimes as a light-emitting point or the light exit opening 310.

The current constriction layer 86b is provided to allow the laser diode LD to oscillate in a low-order single transverse mode (single mode). That is, the post 311 where the laser diode LD is formed is formed to have a circular cross section, which is oxidized from the circumferential portion, thereby achieving a circular cross section of the light exit opening 310 and reducing the area of the light exit opening 310.

In addition, a defect caused by mesa etching is likely to occur in the circumferential portion of the laser diode LD, and non-radiative recombination is likely to occur. The current-blocking area β reduces the electric power to be consumed by non-radiative recombination. Thus, low power consumption and enhanced light extraction efficiency are achieved. The light extraction efficiency is the amount of light that can be extracted per amount of power.

Like the setting thyristor S, the transfer thyristor T1 is constituted by the p-anode layer 81, the voltage reduction layer 89, the n-gate layer 82, the p-gate layer 83, and the n-cathode layer 84. That is, the transfer thyristor Ti is formed by stacking the p-anode layer 81 as an anode, the n-gate layer 82 as an n-gate, the p-gate layer 83 as a p-gate, and the n-cathode layer 84 as a cathode on top of each other. Here, the p-gate layer 83 is provided with a gate electrode (a p-ohmic electrode 331 described below), which functions as a gate for controlling the operation of the transfer thyristor T1.

On the other hand, the coupling diode D1 is constituted by the p-gate layer 83 and the n-cathode layer 84. That is, the coupling diode D1 includes the p-gate layer 83 as an anode, and the n-cathode layer 84 as a cathode.

In a portion corresponding to the transfer thyristor T1 and the coupling diode D1, the n-cathode layer 88, the light-emitting layer 87, the p-anode layer 86, and the tunnel junction layer 85, which form the portion where the setting thyristor S and the laser diode LD are stacked on top of each other, are removed. Further, the n-cathode layer 84 is removed, except for the portion corresponding to the transfer thyristor T1 and the coupling diode D1.

In the portion of the transfer thyristor T1, the n-cathode layer 84 is left as a post 312. In the post 312, an n-ohmic electrode 322 is disposed as a cathode electrode on top of the n-cathode layer 84. The n-ohmic electrode 322 is connected to the transfer signal line 72.

Likewise, in the portion of the coupling diode D1, the n-cathode layer 84 is left as a post 313. In the post 313, an n-ohmic electrode 323 is disposed as a cathode electrode on top of the n-cathode layer 84. The n-ohmic electrode 323 is connected to a line 77.

On a surface where the n-cathode layer 84 is removed and the p-gate layer 83 is exposed, a p-ohmic electrode 331 (see FIG. 2) is disposed, which is formed of a metal material that facilitates the establishment of ohmic contact with a p-type semiconductor layer such as the p-gate layer 83. The p-ohmic electrode 331 is disposed as a gate electrode of the transfer thyristor T1 and as an anode electrode of the coupling diode D1.

Further, the island 301-1, around which the multi-layer semiconductor body is removed by etching up to the substrate 80, is separated from the other islands (such as the islands 301-2, 301-3, 301-4, 302-2, 302-3, 302-4, and 303). The multi-layer semiconductor body may be etched up to the p-anode layer 81 or etched up to a portion of the p-anode layer 81 in the thickness direction.

As described above, in the light-emitting device 10, a plurality of laser diodes LD are defined as a laser diode LD group, and the plurality of laser diodes LD included in the laser diode LD group are allowed to emit light concurrently. In this case, if a line is disposed for each of the laser diodes LD included in the laser diode LD group to provide a signal from the transfer unit 101 to control emission/non-emission of light from the laser diode LD, the laser diodes LD need to be spaced apart from each other a certain distance, resulting in an increase in the area of the light-emitting device 10.

To address this, the light-emitting device 10 according to the first exemplary embodiment is provided with, for each of the laser diodes LD, the setting thyristor S that sets the laser diode LD to the state of being capable of emitting light, and the setting thyristor S and the laser diode LD are stacked on top of each other to prevent an increase in the area of the light-emitting device 10. In addition, the semiconductor layers that form the setting thyristor S are made continuous for each of the laser diode LD groups, which eliminates a need to dispose a line to provide a signal from the transfer unit 101 to control emission/non-emission of light from the laser diode LD. In FIG. 3, the semiconductor layers that are made continuous are the p-anode layer 81, the voltage reduction layer 89, the n-gate layer 82, and the p-gate layer 83. While both the n-gate layer 82 and the p-gate layer 83 are continuous, only one of the n-gate layer 82 and the p-gate layer 83 may be continuous. In the illustrated anode-grounded configuration, it is sufficient that the n-gate layer 82 disposed closer to the substrate 80 be continuous. In a cathode-grounded configuration, conversely, it is sufficient that the p-gate layer 83 be made continuous.

The coupling diode D is constituted by the n-cathode layer 84 and the p-gate layer 83, with the n-ohmic electrode 323 on top of the n-cathode layer 84 serving as a cathode electrode and the p-ohmic electrode 331 serving as an anode electrode (see FIG. 1), the p-ohmic electrode 331 being disposed on top of the p-gate layer 83 and formed of a metal material that facilitates the establishment of ohmic contact with a p-type semiconductor layer such as the p-gate layer 83. The cathode electrode is sometimes represented as a cathode, and the anode electrode is sometimes represented as an anode. In addition, the p-anode layers (the p-anode layers 81 and 86) sometimes function as an anode and the n-cathode layers (the n-cathode layers 84 and 88) as a cathode with no electrode (no anode electrode or cathode electrode) interposed therebetween.

Figure 4:
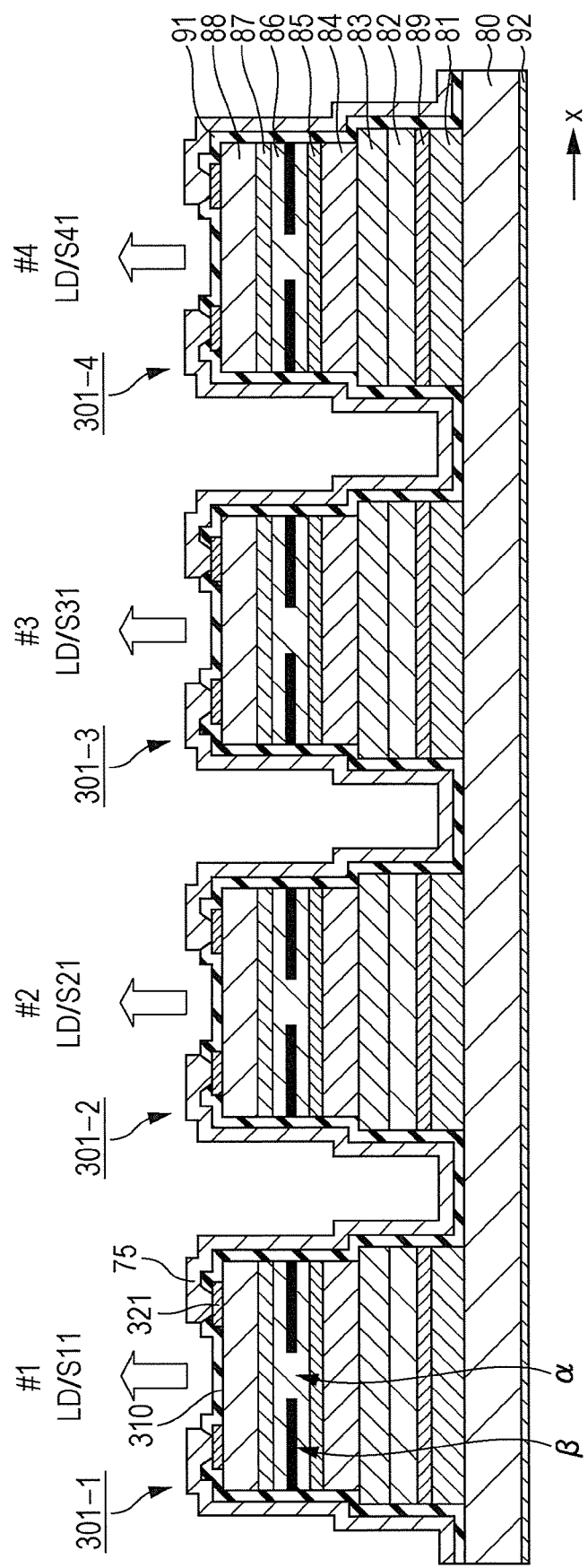
FIG. 4 is a cross-sectional view of the light-emitting device, taken along line IV-IV of FIG. 2.

FIG. 4 is a cross-sectional view of the light-emitting device 10, taken along line IV-IV of FIG. 2. In FIG. 4, a direction extending rightward is defined as the x direction. In FIG. 4, the islands 301-1, 301-2, 301-3, and 301-4 are disposed from the left to the right. In the island 301-1, the laser diode LD11/setting thyristor S11 (LD/S11) included in the laser diode LD group #1 are illustrated. In the island 301-2, the laser diode LD21/setting thyristor S21 (LD/S21) included in the laser diode LD group #2 are illustrated. In the island 301-3, the laser diode LD31/setting thyristor S31

(LD/S31) included in the laser diode LD group #3 are illustrated. In the island 301-4, the laser diode LD41/setting thyristor S41 (LD/S41) included in the laser diode LD group #4 are illustrated. Also, the laser diode LD11/setting thyristor S11 (LD/S11) in the laser diode LD group #1 will be described as an example of the laser diode LD/setting thyristor S, with numerals assigned, and the other laser diodes LD/setting thyristors S are similar and are not assigned numerals.

As illustrated in FIG. 4, in the cross section taken along line IV-IV of FIG. 2, around the islands 301-i, the n-cathode layer 88, the light-emitting layer 87, the p-anode layer 86, the tunnel junction layer 85, the n-cathode layer 84, the p-gate layer 83, the n-gate layer 82, the voltage reduction layer 89, and the p-anode layer 81 are removed up to the substrate 80. The post 311 is formed into a cylindrical shape. The post 311 has a width smaller than the portion including the p-anode layer 81, the voltage reduction layer 89, the n-gate layer 82, and the p-gate layer 83 (see FIG. 2).

On top of the n-cathode layer 88, the n-ohmic electrode 321 is disposed. The n-ohmic electrode 321 is connected to the turn-on signal line 75 via the through-hole formed in the interlayer insulating layer 91. As illustrated in FIG. 2, the turn-on signal line 75 is connected to the φI terminal.

As illustrated in FIG. 4, in each of the laser diode LD groups, the islands 301-i are separated from each other by mesa etching and are electrically disconnected. In contrast, as depicted in the island 301-1 illustrated in FIG. 3, within each of the laser diode LD groups, the p-anode layer 81, the voltage reduction layer 89, the n-gate layer 82, and the p-gate layer 83, which form the transfer thyristor T and the setting thyristor S, are formed to be continuous and are electrically connected.

Referring back to FIG. 2, the other islands 302-i, 303, 304, and 305 will be described. The islands 302-i have the same structure, and thus the island 302-1 will be described as the island 302. The island 302-1 is provided with the power supply line resistor Rg1. In the island 302-1, the n-cathode layer 88, the light-emitting layer 87, the p-anode layer 86, the tunnel junction layer 85, and the n-cathode layer 84 in the multi-layer semiconductor body are removed such that the p-gate layer 83 is exposed. On top of the exposed p-gate layer 83, p-ohmic electrodes 332 and 333 are disposed. The p-gate layer 83 between the p-ohmic electrodes 332 and 333 is used as a resistor.

The island 303 is provided with the start diode SD. In the island 303, the n-cathode layer 88, the light-emitting layer 87, the p-anode layer 86, and the tunnel junction layer 85 in the multi-layer semiconductor body are removed. Further, the p-gate layer 83 is exposed, except for a post 314 in which the n-cathode layer 84 is left. The n-cathode layer 84 of the post 314 is the cathode of the start diode SD, and the p-gate layer 83 is the anode of the start diode SD. An n-ohmic electrode 324, which is disposed on top of the n-cathode layer 84 of the post 314, serves as a cathode electrode, and a p-ohmic electrode 334, which is disposed on top of the exposed p-gate layer 83, serves as an anode electrode.

The island 304 is provided with the current-limit resistor R1, and the island 305 is provided with the current-limit resistor R2. The islands 304 and 305 have a configuration similar to that of the island 302, and are each configured such that two p-ohmic electrodes (assigned no numerals) are disposed on top of the exposed p-gate layer 83, with the portion of the p-gate layer 83 between the two p-ohmic electrodes in the island 304 serving as the current-limit resistor R1 and the portion of the p-gate layer 83 between the two p-ohmic electrodes in the island 305 serving as the current-limit resistor R2.

The islands 301 to 305 and connections between the islands 301 to 305 will be described.

As described above, the n-cathode layer 88, which forms the cathodes of the laser diodes LD disposed in the posts 311 of the islands 301, is connected to the turn-on signal line 75 in parallel via the n-ohmic electrodes 321.

The n-cathode layer 88, which is the cathode of the transfer thyristor T1 disposed in the post 312 of the island 301-1, is connected to the transfer signal line 72 via the n-ohmic electrode 322. The same applies to the transfer thyristor T3 disposed in the island 301-3. That is, the cathodes (the n-cathode layer 88) of the transfer thyristors Ti with the odd numbers i are connected to the transfer signal line 72.

On the other hand, the cathode (the n-cathode layer 88) of the transfer thyristor T2 disposed in the island 301-2 is connected to the transfer signal line 73. That is, the cathodes (the n-cathode layer 88) of the transfer thyristors Ti with the even numbers i are connected to the transfer signal line 73.

The p-ohmic electrode 331, which is the gate Gt1 of the island 301-1, is connected to a line 76. The line 76 is connected to the p-ohmic electrode 332 of the power supply line resistor Rg1 disposed in the island 302-1 and the n-ohmic electrode 324, which is the cathode electrode of the start diode SD disposed in the island 303.

The cathode (the n-cathode layer 88) of the coupling diode D1 disposed in the post 313 of the island 301-1 is connected to the line 77 via the n-ohmic electrode 323. The line 77 is connected to the gate electrode (assigned no numeral) of the gate Gt2 of the adjacent island 301-2 and a p-ohmic electrode (assigned no numeral) of the power supply line resistor Rg2 of the island 302-2.

The p-ohmic electrode 333 of the power supply line resistor Rg1 of the island 302-1 is connected to the power supply line 71. The same applies to the power supply line resistor Rg2 and the like in the other island 302-2 and the like. The power supply line 71 is connected to the Vgk terminal.

The transfer signal line 72 is connected to one of the p-ohmic electrodes (assigned no numeral) of the current-limit resistor R1 of the island 304. The other p-ohmic electrode (assigned no numeral) of the current-limit resistor R1 is connected to the φ1 terminal. The transfer signal line 73 is connected to the p-ohmic electrode 334 of the start diode SD of the island 303, and is also connected to one of the p-ohmic electrodes (assigned no numeral) of the current-limit resistor R2 of the island 305. The other p-ohmic electrode (assigned no numeral) of the current-limit resistor R2 of the island 305 is connected to the φ2 terminal.

Thyristor

Next, the operation of the setting thyristor S and the transfer thyristor T and the voltage reduction layer 89 will be described. Since the operations of the setting thyristor S and the transfer thyristor T are the same, the transfer thyristor T1 in the island 301-1 will be described as a thyristor Th.

Figure 5A:
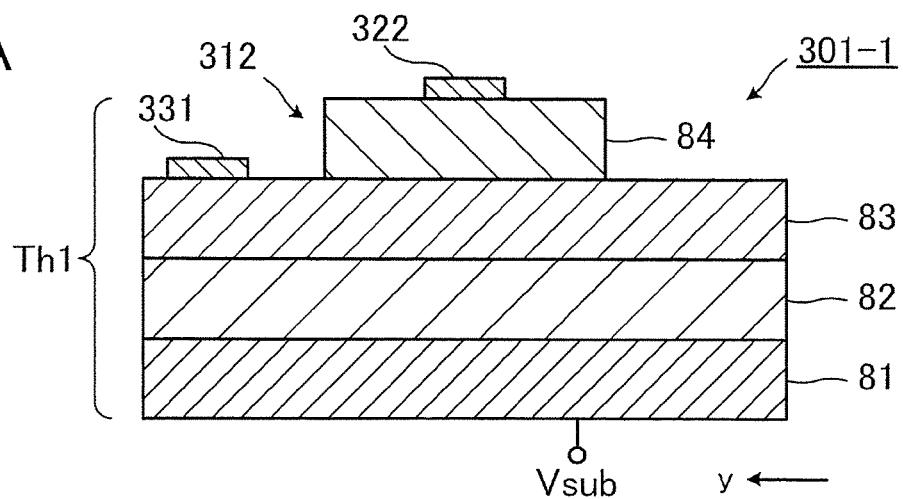
Figure 5B:
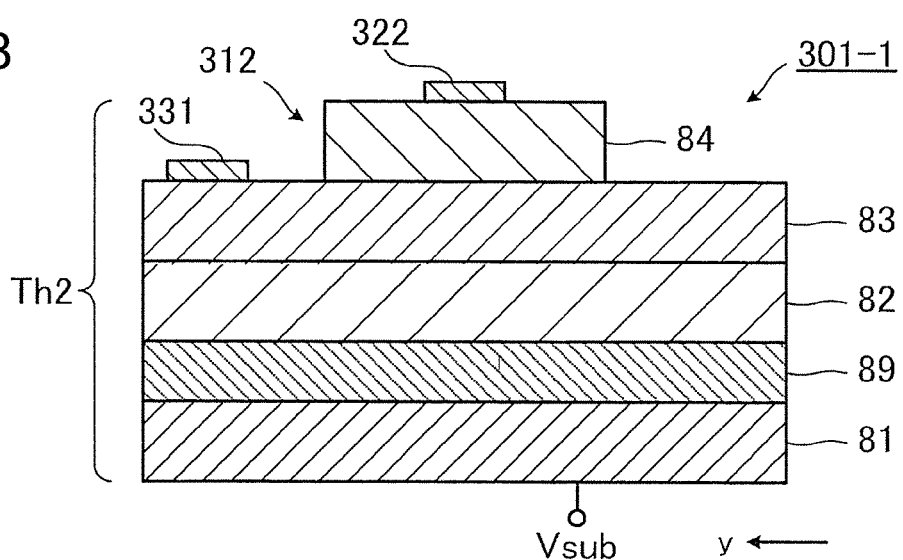
Figure 5C:
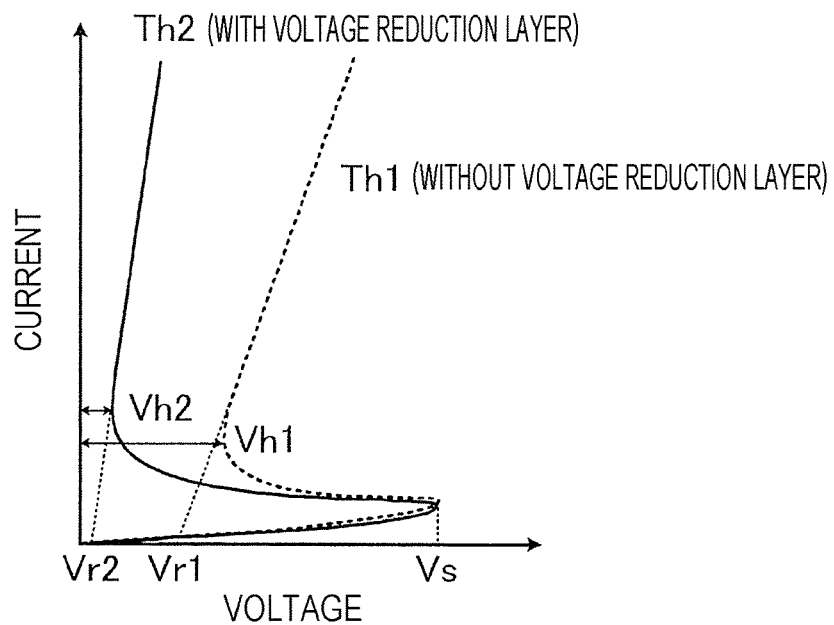

FIGS. 5A to 5C illustrate the operation of the thyristor Th. FIG. 5A is a cross-sectional view of a thyristor Th1 that does not include the voltage reduction layer 89, FIG. 5B is a cross-sectional view of a thyristor Th2 that includes the voltage reduction layer 89, and FIG. 5C illustrates the characteristics of the thyristors Th1 and Th2.

The thyristor Th1 illustrated in FIG. 5A, which includes no voltage reduction layer, is formed by stacking the p-anode layer 81, the n-gate layer 82, the p-gate layer 83, and the n-cathode layer 84 on top of each other. A portion of the n-cathode layer 84, except for the post 312, is removed, and the p-gate layer 83 is exposed. On top of the p-gate layer 83, the p-ohmic electrode 331 is formed (see FIG. 2).

The thyristor Th2 illustrated in FIG. 5B, which includes the voltage reduction layer 89, includes the voltage reduction layer 89 between the p-anode layer 81 and the n-gate layer 82.

As illustrated in FIGS. 3 and 4, the p-anode layer 81 of the thyristors Th1 and Th2 is connected to the substrate 80 (not illustrated in FIGS. 5A and 5B) and is set to the reference potential Vsub.

As described above, the thyristor Th is a three-terminal semiconductor element having an anode, a cathode, and a gate. The thyristor Th is formed by stacking p-type semiconductor layers (the p-anode layer 81 and the p-gate layer 83) and n-type semiconductor layers (the n-gate layer 82 and the n-cathode layer 84), which are formed of a material such as GaAs, GaAlAs, or AlAs, on top of each other. That is, the thyristor Th has a pnpn structure. As an example, a forward potential (diffusion potential) Vd of a pn junction formed by a p-type semiconductor layer and an n-type semiconductor layer is set to 1.5 V.

First, the operation of the thyristor Th1 illustrated in FIG. 5A, which does not include the voltage reduction layer 89, will be described. As an example, the reference potential Vsub of the p-anode layer 81 is set to 0 V as a high-level potential (hereinafter referred to as "H"), and the power supply potential Vgk supplied to the Vgk terminal (see FIG. 2) is set to −3.3 V as a low-level potential (hereinafter referred to as "L"), which are sometimes represented as "H (0 V)" and "L (−3.3 V)", respectively. As illustrated in FIG. 1, the Vgk terminal is connected to the gate (or the gate Gt1 when the thyristor Th is the transfer thyristor T1) via the power supply line resistor Rg1.

The thyristor Th1, which does not include the voltage reduction layer 89, has a characteristic represented by "without voltage reduction layer" in FIG. 5C.

When a potential lower than (a negative potential having a larger absolute value than) a threshold voltage is applied to the cathode of the thyristor Th1 in an off-state where no current flows between the anode and the cathode thereof, the thyristor Th1 enters an on-state (turned on). The threshold voltage for the thyristor Th1 is equal to a value obtained by subtracting the forward potential Vd (1.5 V) of the pn junction from the potential at the gate.

When the thyristor Th1 enters the on-state, the gate of the thyristor Th1 has a potential close to the potential at the anode. Since the anode has a potential of 0 V, the potential at the gate becomes equal to 0 V. The cathode of the thyristor Th1 in the on-state has a potential (the absolute value being denoted by a holding voltage) close to a potential obtained by subtracting the forward potential Vd (1.5 V) of the pn junction from the potential at the anode. Since the anode has a potential of 0 V, the cathode of the thyristor Th1 in the on-state becomes equal to a potential close to −1.5 V (a negative potential having a larger absolute value than 1.5 V) (Vh1 in FIG. 5C). The holding voltage is set to 1.5 V.

To the cathode of the thyristor Th1 in the on-state, a potential lower than (a negative potential having a larger absolute value than) a potential necessary to keep the thyristor Th1 in the on-state is continuously applied. When current capable of keeping the on-state (maintaining current) is supplied, the thyristor Th1 is kept in the on-state.

In contrast, when the cathode of the thyristor Th1 in the on-state has a potential higher (a negative potential having a smaller absolute value, 0 V, or a positive potential) than the potential necessary to keep the thyristor Th1 in the on-state (the potential close to −1.5 V, described above), the thyristor Th1 enters an off-state (turned off).

Next, the operation of the thyristor Th2 illustrated in FIG. 5B, which includes the voltage reduction layer 89, will be described.

A rising voltage Vr (see FIG. 5C) of the thyristor Th is determined by the energy of the smallest band gap (band gap energy) in the multi-layer semiconductor body of the thyristor Th. The rising voltage Vr of the thyristor Th is a voltage obtained by, as illustrated in FIG. 5C, extrapolating the current in the thyristor Th in the on-state to the voltage axis.

The voltage reduction layer 89 is a layer having a smaller band gap energy than the p-anode layer 81, the n-gate layer 82, the p-gate layer 83, and the n-cathode layer 84. Accordingly, a rising voltage Vr2 of the thyristor Th2 is lower than the rising voltage Vr1 of the thyristor Th1 illustrated in FIG. 5A, which does not include the voltage reduction layer 89. As an example, the voltage reduction layer 89 is a layer with a smaller band gap than the band gap of the light-emitting layer 87.

The setting thyristor S and the transfer thyristor T are not used as light-emitting elements, but are provided to drive a light-emitting element such as the laser diode LD. Thus, the band gap of the setting thyristor S and the transfer thyristor T is determined irrespective of the wavelength of light emitted from a light-emitting element such as the laser diode LD. With the use of the voltage reduction layer 89 with a smaller band gap than the band gap of the light-emitting layer 87, the rising voltage of a thyristor is reduced from Vr1 to Vr2 (Vr1>Vr2). While the rising voltage Vr of a thyristor has been described, the same applies to the holding voltage Vh, which is a voltage for keeping the thyristor in the on-state (see FIG. 5C). That is, the holding voltage becomes equal to 1.5 V (Vh1) when the voltage reduction layer 89 is not included, and becomes equal to 0.8 V (Vh2) when the voltage reduction layer 89 is included.

A switching voltage Vs (see FIG. 5C) of the thyristor Th is determined by a depletion layer of a reverse-biased semiconductor layer. Thus, the switching voltage Vs of the thyristor Th is less affected by the voltage reduction layer 89.

Figure 6:
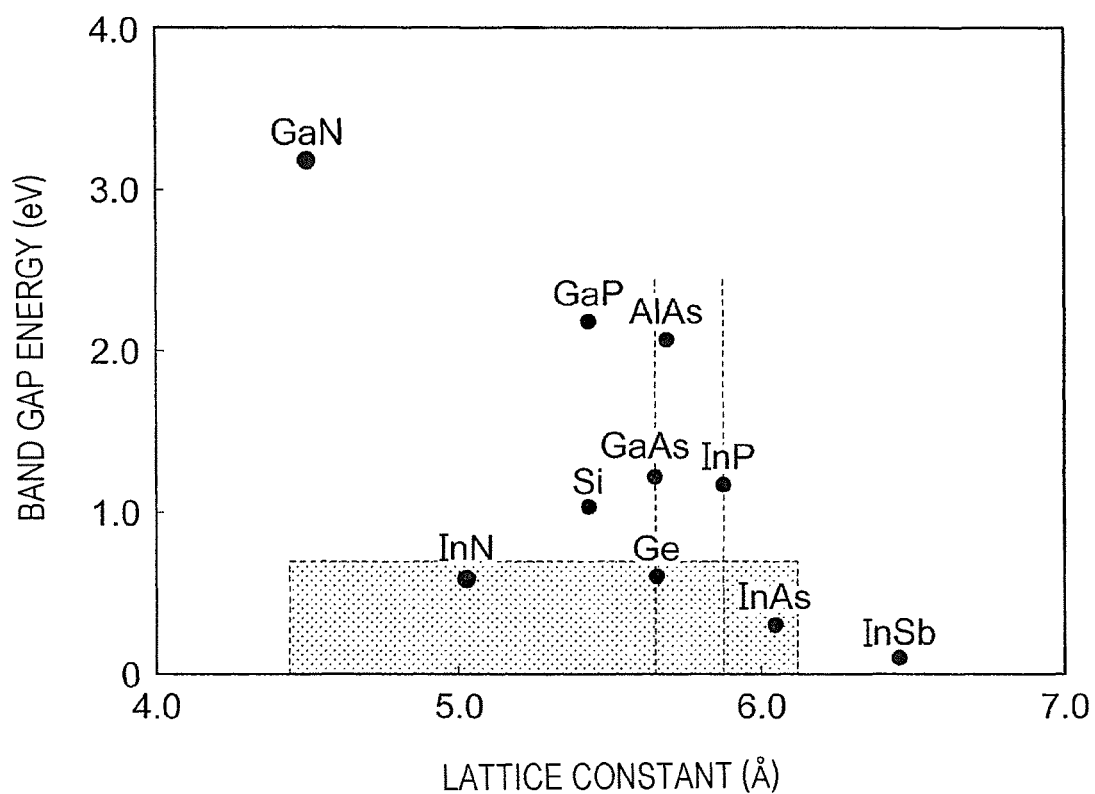
FIG. 6 illustrates band gap energies of materials of semiconductor layers.

FIG. 6 illustrates band gap energies of materials of semiconductor layers.

GaAs has a lattice constant of approximately 5.65 Å. AlAs has a lattice constant of approximately 5.66 Å. A material having a lattice constant close to these lattice constants can be epitaxially grown on a GaAs substrate. For example, AlGaAs or Ge, which is a compound of GaAs and AlAs, can be epitaxially grown on a GaAs substrate.

InP has a lattice constant of approximately 5.87 Å. A material having a lattice constant close to this lattice constant can be epitaxially grown on an InP substrate.

GaN has a different lattice constant depending on the growth plane, and with the lattice constant being 3.19 Å for the a-plane and 5.17 Å for the c-plane. A material having a lattice constant close to these lattice constants can be epitaxially grown on a GaN substrate.

Materials with band gap energies that provide reduced rising voltage of the thyristor Th for GaAs, InP, and GaN are included in a shaded range illustrated in FIG. 6. That is, when a material included in the shaded range is used for a layer of the thyristor Th, the rising voltage Vr of the thyristor Th becomes equal to the band gap energy of the material included in the shaded range.

For example, GaAs has a band gap energy of approximately 1.43 eV. Without the voltage reduction layer 89, the rising voltage Vr1 of a thyristor is approximately 1.43 V. However, when a material included in the shaded range is used for or included in a layer of the thyristor, the rising voltage Vr2 of the thyristor may be set to be higher than 0 V and less than 1.43 V (0 V<Vr2<1.43 V).

Consequently, power consumption is reduced when a thyristor is in the on-state.

Examples of the material included in the shaded range include Ge with a band gap energy of approximately 0.67 eV for GaAs. Other examples of the material include InAs with a band gap energy of approximately 0.36 eV for InP. Materials having a small band gap energy, such as a compound of GaAs and InP, a compound of InN and InSb, or a compound of InN and InAs, may be used for a GaAs substrate or an InP substrate. In particular, a GaInNAs-based compound mixture is suitable. These may contain Al, Ga, As, P, Sb, or the like. In addition, GaNP may serve as the voltage reduction layer 89 for GaN. Any other material such as (1) an InN layer, an InGaN layer, or a GaNAs layer obtained by metamorphic growth or the like, (2) quantum dots of InN, InGaN, InNAs, InNSb, or GaNAs, or (3) an InAsSb layer having a lattice constant that is twice the lattice constant of GaN (the a-plane), may be used as the voltage reduction layer 89. These may contain Al, Ga, N, As, P, Sb, or the like.

That is, the voltage reduction layer 89 reduces the rising voltage Vr while maintaining the switching voltage Vs of the thyristor Th. Accordingly, the holding voltage applied to the thyristor Th in the on-state is reduced, and power consumption is reduced. The switching voltage Vs of the thyristor Th is set to any value by adjusting the materials, impurity concentrations, and the like of the p-anode layer 81, the n-gate layer 82, the p-gate layer 83, and the n-cathode layer 84. The voltage reduction layer 89 is optional. Note that the switching voltage Vs changes depending on the position at which the voltage reduction layer 89 is inserted.

While FIG. 5B illustrates an example in which a single voltage reduction layer 89 is provided, a plurality of voltage reduction layers 89 may be provided. For example, the voltage reduction layer 89 may be disposed between the p-anode layer 81 and the n-gate layer 82, between the n-gate layer 82 and the p-gate layer 83, and between the p-gate layer 83 and the n-cathode layer 84. Alternatively, the voltage reduction layer 89 may be disposed in the n-gate layer 82 and in the p-gate layer 83. In addition, two or three layers may be selected from among the p-anode layer 81, the n-gate layer 82, the p-gate layer 83, and the n-cathode layer 84, and the voltage reduction layer 89 may be disposed in each of the selected two or three layers. The conductivity types of these voltage reduction layers 89 may be set to match the conductivity types of the anode layer, the cathode layer, and the gate layers where the voltage reduction layers 89 are disposed, or may be i-type.

Tunnel Junction Layer 85

Next, as illustrated in FIGS. 3 and 4, the setting thyristor S and the laser diode LD in each of the islands 301 are stacked on top of each other with the tunnel junction layer 85 interposed therebetween. Accordingly, the setting thyristor S and the laser diode LD are connected in series.

Figure 7A:
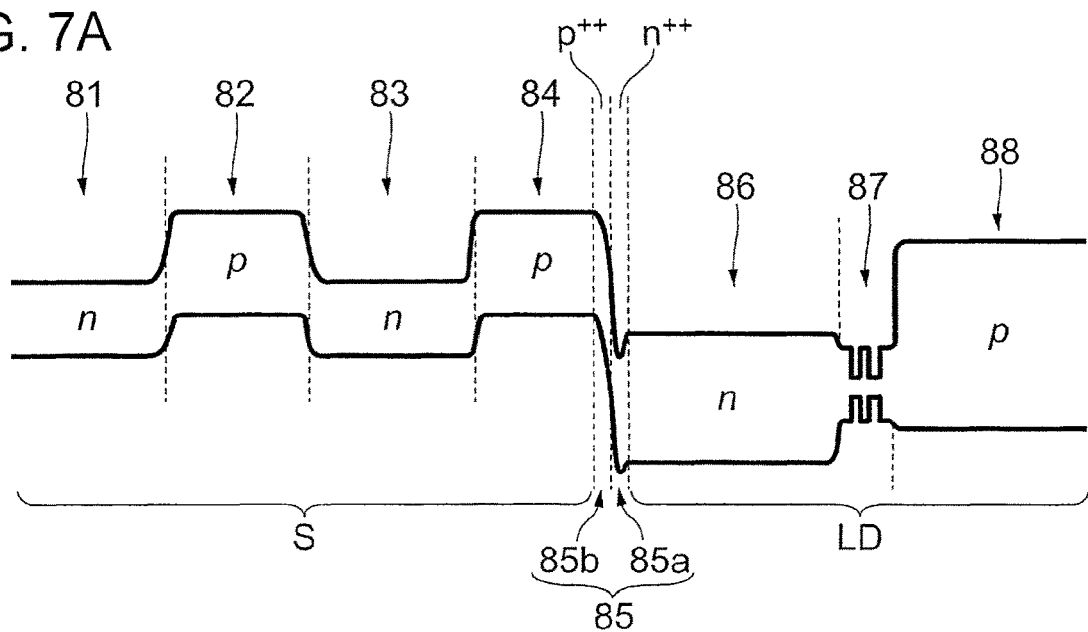
Figure 7B:
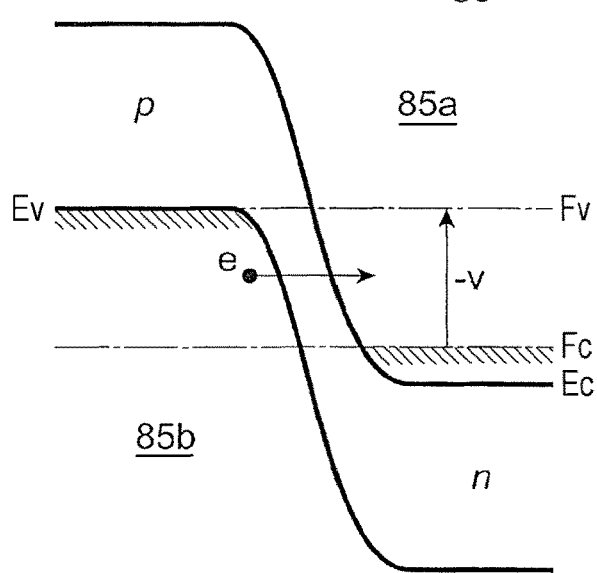
Figure 7C:
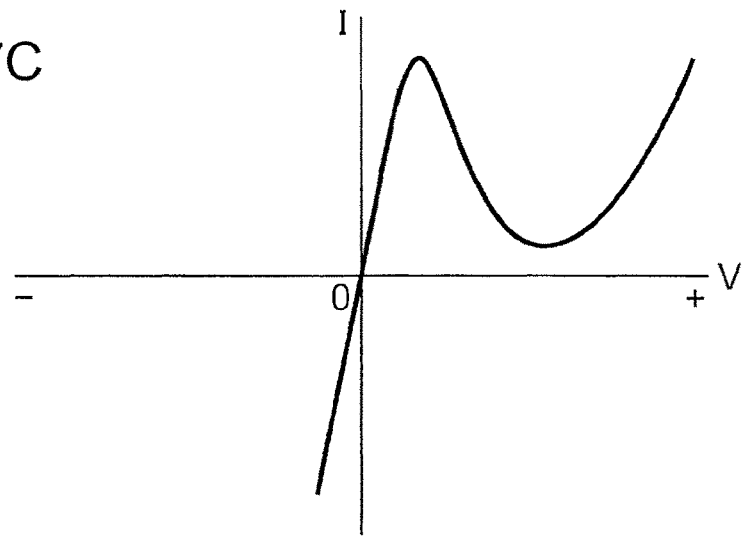

FIGS. 7A to 7C further illustrate the multi-layer structure of the setting thyristor S and the laser diode LD. FIG. 7A is a schematic energy band diagram of the multi-layer structure of the setting thyristor S and the laser diode LD, FIG. 7B is an energy band diagram of the tunnel junction layer 85 in reverse bias, and FIG. 7C illustrates a current-voltage characteristic of the tunnel junction layer 85. In FIGS. 7A to 7C, the voltage reduction layer 89 is not illustrated.

Voltage is applied between the n-ohmic electrode 321 to which the turn-on signal ϕI is applied and the back-surface electrode 92 with the reference potential Vsub illustrated in FIGS. 3 and 4 so that the setting thyristor S and the laser diode LD are forward-biased. Then, as illustrated in the energy band diagram in FIG. 7A, the interface of an $n^{++}$ layer 85a and $p^{++}$ layer 85b of the tunnel junction layer 85 is reverse-biased.

The tunnel junction layer 85 is a junction of the n++ layer 85a doped with an n-type impurity at a high concentration and the p++ layer 85b doped with a p-type impurity at a high concentration. This results in a depletion region with a small width. Forward bias allows electrons to tunnel from the conduction band on the n++ layer 85a side to the valence band on the p++ layer 85b side. In this case, the tunnel junction layer 85 exhibits a negative resistance characteristic (see the forward bias side (+V) in FIG. 7C).

On the other hand, as illustrated in FIG. 7B, when the tunnel junction layer 85 is reverse-biased (−V), a potential Ev of the valence band on the p++ layer 85b side becomes higher than a potential Ec of the conduction band on the n++ layer 85a side. Then, electrons tunnel from the valence band on the p++ layer 85b side to the conduction band on the n++ layer 85a side. As the reverse bias voltage (−V) increases, electrons are more likely to tunnel. That is, as illustrated in the reverse bias side (−V) in FIG. 7C, current is more likely to flow through the tunnel junction layer 85 (tunnel junction) as the reverse bias becomes greater.

Thus, as illustrated in FIG. 7A, when voltage is applied so that the setting thyristor S and the laser diode LD are forward-biased and the setting thyristor S is turned on and enters the on-state, current flows from the setting thyristor S to the laser diode LD even if the tunnel junction layer 85 is in reverse bias.

In place of the tunnel junction layer 85, a group III-V compound layer having metallic conductivity and epitaxially grown on a group III-V compound semiconductor layer may be used. Examples of the group III-V compound layer having metallic conductivity include InNAs, which has negative band gap energy when, for example, the InN composition ratio x is in the range of approximately 0.1 to approximately 0.8. InNSb has negative band gap energy when, for example, the InN composition ratio x is in the range of approximately 0.2 to approximately 0.75. The term negative band gap energy is used to indicate that no band gap exists. Thus, conductive characteristics (conduction characteristics) similar to those of metals are exhibited. That is, the term metallic conductive characteristics (conductivity) is used to indicate that current flows if the electric potential has a gradient, as in metals.

The lattice constants of the group III-V compounds (semiconductors) such as GaAs and InP are in the range of 5.6 Å to 5.9 Å. These lattice constants are close to that of Si, which is approximately 5.43 Å, and that of Ge, which is approximately 5.66 Å.

In contrast, the lattice constant of InN, which is also a group III-V compound, is approximately 5.0 Å for a zinc blende structure, and the lattice constant of InAs is approximately 6.06 Å. Thus, the lattice constant of InNAs, which is a compound of InN and InAs, may take a value close to 5.6 Å to 5.9 Å, as with GaAs or the like.

The lattice constant of InSb, which is a group III-V compound, is approximately 6.48 Å. Since InN has a lattice constant of approximately 5.0 Å, the lattice constant of InNSb, which is a compound of InSb and InN, may take a value close to 5.6 Å to 5.9 Å, as with GaAs or the like.

That is, InNAs and InNSb can be monolithically epitaxially grown on a layer of a group III-V compound (semiconductor), such as GaAs. Furthermore, a layer of a group III-V compound (semiconductor), such as GaAs, can be monolithically stacked on top of a layer of InNAs or InNSb by epitaxial growth.

Accordingly, stacking the setting thyristor S and the laser diode LD with a group III-V compound layer having metallic conductivity interposed therebetween in place of the tunnel junction layer 85 such that the setting thyristor S and the laser diode LD are connected in series may prevent the n-cathode layer 84 of the setting thyristor S and the p-anode layer 86 of the laser diode LD from being reverse-biased.

Operation of Stacked Setting Thyristor S and Laser Diode LD

Next, the operation of the setting thyristor S and the laser diode LD, which are stacked on top of each other, will be described.

The rising voltage of the laser diode LD is set to 1.5 V. That is, if a voltage of 1.5 V or higher is applied between the anode and the cathode of the laser diode LD, the laser diode LD emits light.

The turn-on signal ϕI is set to 0 V ("H (0 V)") or −3.3 V ("L (−3.3 V)"). A potential of 0 V allows the laser diode LD to enter the off-state, and a potential of −3.3 V allows the laser diode LD to enter the on-state from the off-state.

When the laser diode LD is changed from the off-state to the on-state, the turn-on signal ϕI is set to "L (−3.3 V)". At this time, if −1.5 V is applied to the gate Gs of the setting thyristor S, the threshold voltage for the setting thyristor S becomes equal to −3 V, which is obtained by subtracting the forward potential Vd (1.5 V) of the pn junction from the potential (−1.5 V) at the gate Gs. In this case, since the turn-on signal ϕI is set to −3.3 V, the setting thyristor S is turned on and is changed from the off-state to the on-state. In addition, the laser diode LD is also changed from the off-state to the on-state. That is, the laser diode LD performs laser oscillation and emits light. Then, since the voltage (holding voltage Vr) applied to the setting thyristor S in the on-state is 0.8 V, 2.5 V is applied to the laser diode LD. Since the rising voltage of the laser diode LD is 1.5 V, the laser diode LD continuously emits light.

On the other hand, when the turn-on signal ϕI is set to 0 V, the voltage across a series connection of the setting thyristor S and the laser diode LD is 0 V, resulting in the setting thyristor S being changed from the on-state to the off-state (turned off). In addition, the laser diode LD does not emit light.

The operation of the light-emitting device 10 will be described in detail.

Configuration of Multi-Layer Semiconductor Body

As described above, a multi-layer semiconductor body is formed by stacking the substrate 80, the p-anode layer 81, the voltage reduction layer 89, the n-gate layer 82, the A-gate layer 83, the n-cathode layer 84, the tunnel junction layer 85, the p-anode layer 86, the light-emitting layer 87, and the n-cathode layer 88 on top of each other.

As described above, the substrate 80 is described as a p-type GaAs substrate, by way of example. However, the substrate 80 may be formed of n-type GaAs or intrinsic (i-type) GaAs not doped with impurities. Alternatively, a semiconductor substrate formed of InP, GaN, InAs, or other group III-V or II-VI material, or a substrate formed of sapphire, Si, Ge, or the like may be used. When the material of the substrate 80 is changed, a material monolithically stacked on the substrate may be a material having a lattice constant that substantially matches that of the substrate (including a strain structure, a strain relaxation layer, and metamorphic growth). As an example, InAs, InAsSb, GaInAsSb, or the like is used on an InAs substrate; InP, InGaAsP, or the like is used on an InP substrate; GaN, AlGaN, or InGaN is used on a GaN substrate or a sapphire substrate; and Si, SiGe, GaP, or the like is used on a Si substrate. If the substrate 80 is electrically insulating, a line needs to be provided to supply the reference potential Vsub. When a multi-layer semiconductor body, except for the substrate 80, is attached to another supporting substrate and the multi-layer semiconductor body is disposed on the other supporting substrate, the multi-layer semiconductor body need not have a lattice constant that matches that of the supporting substrate.

The p-anode layer 81 is formed of, for example, p-type $Al_{0.9}GaAs$ with an impurity concentration of $1 \times 10^{18}/cm^3$. The Al composition may be changed in the range of 0 to 1.

The n-gate layer 82 is formed of, for example, n-type $Al_{0.9}GaAs$ with an impurity concentration of $1 \times 10^{17}/cm^3$. The Al composition may be changed in the range of 0 to 1.

The p-gate layer 83 is formed of, for example, p-type $Al_{0.9}GaAs$ with an impurity concentration of $1 \times 10^{17}/cm^3$. The Al composition may be changed in the range of 0 to 1.

The n-cathode layer 84 is formed of, for example, n-type $Al_{0.9}GaAs$ with an impurity concentration of $1 \times 10^{18}/cm^3$. The Al composition may be changed in the range of 0 to 1.

The tunnel junction layer 85 is configured as a junction of the n++ layer 85a doped with an n-type impurity at a high concentration and the p++ layer 85b doped with an n-type impurity at a high concentration (see FIG. 7A). The n++ layer 85a and the p++ layer 85b have an impurity concentration as high as $1 \times 10^{20}/cm^3$, for example. A common impurity concentration in the junction is in the order of $10^{17}/cm^3$ to $10^{18}/cm^3$. Examples of the combination of the n++ layer 85a and the p++ layer 85b (hereinafter referred to as the n++ layer 85a/p++ layer 85b) include $n^{++}$ GaInP/$p^{++}$ GaAs, $n^{++}$ GaInP/$p^{++}$ AlGaAs, $n^{++}$ GaAs/$p^{++}$ GaAs, $n^{++}$ AlGaAs/$p^{++}$ AlGaAs, $n^{++}$ InGaAs/$p^{++}$ InGaAs, $n^{++}$ GaInAsP/$p^{++}$ GaInAsP, and $n^{++}$ GaAsSb/$p^{++}$ GaAsSb. The elements of the combinations may be interchanged.

The p-anode layer 86 is formed by stacking the lower p-anode layer 86a, the current constriction layer 86b, and the upper p-anode layer 86c on top of each other in sequence. The lower p-anode layer 86a and the upper p-anode layer 86c are formed of, for example, p-type $Al_{0.9}GaAs$ with an impurity concentration of $5 \times 10^{17}/cm^3$. The Al composition may be changed in the range of 0 to 1.

The current constriction layer 86b is formed of, for example, AlAs or p-type AlGaAs with a high impurity concentration of Al. Any material may be used so long as Al is oxidized to form $Al_2O_3$, which increases electrical resistance, resulting in the formation of a current-blocking area β. The current-blocking area β may be formed by implanting hydrogen ion ($H^+$) ($H^+$ ion implantation) in a semiconductor layer of GaAs, AlGaAs, or the like.

The light-emitting layer 87 has a quantum well structure in which well layers and barrier layers are alternately stacked. The well layers are formed of, for example, GaAs, AlGaAs, InGaAs, GaAsP, AlGaInP, GaInAsP, GaInP, or the like, and the barrier layers are formed of, AlGaAs, GaAs, GaInP, GaInAsP, or the like. The light-emitting layer 87 may have a quantum line (quantum wire) structure or a quantum box (quantum dot) structure.

The n-cathode layer 88 is formed of, for example, n-type $Al_{0.9}GaAs$ with an impurity concentration of $5 \times 10^{17}/cm^3$. The Al composition may be changed in the range of 0 to 1.

These semiconductor layers are stacked using metal organic chemical vapor deposition (MOCVD) or molecular beam epitaxy (MBE), for example. As a result, a multi-layer semiconductor body is formed.

Instead of the AlGaAs-based materials described above, GaInP or the like may be used. Alternatively, a GaN substrate or an InP-based substrate may be used. In addition, the laser diode LD, which is constituted by the p-anode layer 86, the light-emitting layer 87, and the n-cathode layer 88, may be formed of a material having a different lattice constant from that of the material of the setting thyristor S and the transfer thyristor T, which are constituted by the p-anode layer 81, the n-gate layer 82, the p-gate layer 83, and the n-cathode layer 84. Metamorphic growth may be used, or the setting thyristor S and the transfer thyristor T may be grown separately from the laser diode LD and may be attached to the laser diode LD. In this case, the lattice constant of the tunnel junction layer 85 may be made to substantially match that of either material.

The light-emitting device 10 may be produced using a well-known technique such as photolithography or etching, and the method for producing the light-emitting device 10 will not be described herein.

Operation of Light-Emitting Device 10

Figure 8:
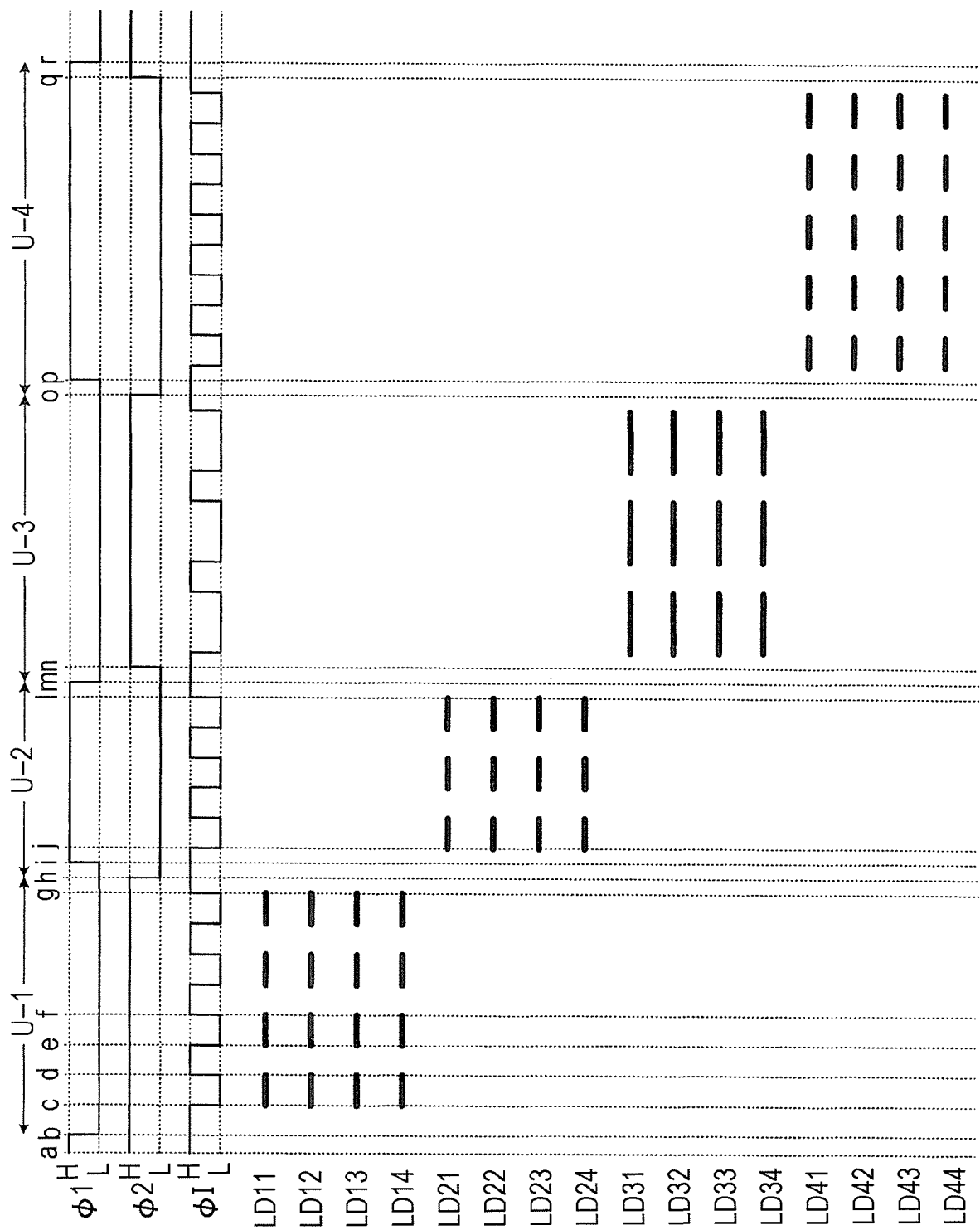
FIG. 8 illustrates an example time chart for controlling emission/non-emission of light from laser diodes of the light-emitting device.

FIG. 8 illustrates an example time chart for controlling emission/non-emission of light from the laser diodes LD of the light-emitting device 10. In the illustrated example, as described above with reference to FIGS. 1 and 2, each laser diode LD group includes four laser diodes LD, by way of example. In FIG. 8, time elapses in alphabetical order (a, b, c, etc.). In the timing chart illustrated in FIG. 8, the laser diode LD groups #1 to #4 are controlled. Periods during which the laser diode LD groups #1 to #4 are caused to emit light in sequence are represented by periods U-1 to U-4, respectively. As described below, the periods U-1 to U-4 have different lengths. However, the periods U-1 to U-4 may have the same length.

The time chart illustrated in FIG. 8 will be described with reference to FIG. 1.

At time a, power is supplied to the control unit 20 illustrated in FIG. 1. Then, the reference potential Vsub is set to "H (0 V)", and the power supply potential Vgk is set to "L (−3.3 V)".

Next, the waveforms of the signals (the transfer signals ϕ1 and ϕ2 and the turn-on signal ϕI) will be described. The periods U-1, U-2, U-3, and U-4 are basically the same, and thus the period U-1 will be described mainly. The periods U-1 to U-4 are referred to as period U unless distinguished otherwise.

The transfer signal ϕ1 is a signal set to "H (0 V)" or "L (−3.3 V)". The transfer signal ϕ1 is "H (0 V)" at time a, and is changed to "L (−3.3 V)" at time b. Then, at time the transfer signal ϕ1 returns to "H (0 V)". Then, at time m, the transfer signal ϕ1 is changed to "L (−3.3 V)" again. The transfer signal ϕ2 is also a signal set to "H (0 V)" or "L (−3.3 V)". The transfer signal ϕ2 is "H (0 V)" at time a, and is changed to "L (−3.3 V)" at time h. Then, at time n, the transfer signal ϕ2 returns to "H (0 V)".

After time b, the transfer signals ϕ1 and ϕ2 are alternately changed to "H (0 V)" and "L (−3.3 V)", with the period during which both the transfer signals ϕ1 and ϕ2 are set to "L (−3.3 V)" (e.g., the period from time h to time i) interposed therebetween. The period from time b at which the transfer signal ϕ1 is changed from "H (0 V)" to "L (−3.3 V)" to time h at which the transfer signal ϕ2 is changed from "H (0 V)" to "L (−3.3 V)" is represented by the period U-1, and the period from time h at which the transfer signal ϕ2 is changed from "H (0 V)" to "L (−3.3 V)" to time m at which the transfer signal ϕ1 is changed from "H (0 V)" to "L (−3.3 V)" is represented by the period U-2. The same applies to the periods U-3 and U-4.

The turn-on signal ϕI is a signal set to "H (0 V)" or "L (−3.3 V)". The turn-on signal ϕI is repeatedly changed to "H (0 V)" and "L (−3.3 V)" during a period within each of the periods U in which one of the transfer signals ϕ1 and ϕ2 is "H (0 V)" and the other signal is "L (−3.3 V)", for example, during the period from time c to time g within the period U-1 or during the period from time j to time l within the period U-2. The turn-on signal ϕI is "H (0 V)" during the remaining periods.

Next, the time chart of the FIG. 8 will be described with reference to FIG. 1. In FIG. 8, periods during which the laser diodes LD emit light are represented by solid lines.

At time a, power is supplied to the control unit 20 illustrated in FIG. 1, the reference potential Vsub is set to "H (0 V)", and the power supply potential Vgk is set to "L (−3.3 V)". Then, the transfer signals ϕ1 and ϕ2 are set to "H (0 V)". The cathode of the start diode SD is set to the power supply potential Vgk ("L (−3.3 V)") via the power supply line resistor Rg1, and the anode of the start diode SD is set to the transfer signal ϕ2 "H (0 V)" via the current-limit resistor R2. Accordingly, the start diode SD is forward-biased, and the gate Gt1 of the transfer thyristor T1 becomes equal to −1.5 V. Consequently, the threshold voltage for the transfer thyristor T1 becomes equal to −3 V.

At time b, the transfer signal ϕ1 is changed from "H (0 V)" to "L (−3.3 V)". At this time, since the threshold voltage for the transfer thyristor T1 is −3 V, the transfer thyristor T1 is turned on and is changed from the off-state to the on-state. Then, the gate Gt1 becomes equal to 0 V. Accordingly, the gate Gs1 of the setting thyristors S11 to S14, which are connected to the gate Gt1, becomes equal to −1.5 V. Then, the threshold voltage for the setting thyristors S11 to S14 becomes equal to −3 V. At time b, the turn-on signal ϕI is "H (0 V)". That is, 0 V is applied across a series connection of the setting thyristors S and the laser diodes LD. Thus, the setting thyristors S are in the off-state, and the laser diodes LD do not emit light.

At time c, the turn-on signal ϕI is changed from "H (0 V)" to "L (−3.3 V)". Then, the setting thyristors S11 to S14 for which the threshold voltage is equal to −3 V are turned on and is changed from the off-state to the on-state. Then, as described above, current flows through the laser diodes LD11 to LD14, from which light is emitted. At this time, the cathode-anode voltage of the setting thyristors S11 to S14 becomes equal to 0.8 V, and the cathode-anode voltage of the laser diodes LD11 to LD14 becomes equal to 2.5 V. Consequently, the laser diodes LD11 to LD14 are kept emitting light. That is, at time c, the laser diodes LD11 to LD14 included in the laser diode LD group #1 emit light concurrently.

At time d, the turn-on signal ϕI is changed from "L (−3.3 V)" to "H (0 V)". Then, the voltage across a series connection of the setting thyristors S and the laser diodes LD is 0 V, resulting in the setting thyristors S11 to S14 being turned off and being changed from the on-state to the off-state. In addition, the laser diodes LD11 to LD14 are unlit. That is, at time d, the laser diodes LD11 to LD14 included in the laser diode LD group #1 do not emit light concurrently. However, the threshold voltage for the setting thyristors S11 to S14 is kept at −3 V.

Thus, at time e, the turn-on signal ϕI is changed from "H (0 V)" to "L (−3.3 V)". Then, the setting thyristors S11 to S14 for which the threshold voltage is equal to −3 V are turned on again and is changed from the off-state to the on-state. As a result, the laser diodes LD11 to LD14 emit light.

At time f, the turn-on signal φI is changed from "L (−3.3 V)" to "H (0 V)". Then, the setting thyristors S11 to S14 are turned off again and is changed from the on-state to the off-state. As a result, the laser diodes LD11 to LD14 are unlit.

That is, in the period U-1 from time b at which the transfer signal φ1 is changed from "H (0 V)" to "L (−3.3 V)" to time h at which the transfer signal φ2 is changed from "H (0 V)" to "L (−3.3 V)", the turn-on signal φ1 is repeatedly changed from "H (0 V)" to "L (−3.3 V)" and then from "L (−3.3 V)" to "H (0 V)". Accordingly, the laser diodes LD11 to LD14 included in the laser diode LD group #1 emit light concurrently in a pulsed manner (intermittently). In the period U-1, four light pulses are emitted.

Likewise, in the period U-2 from time h to time m, the laser diodes LD21 to LD24 included in the laser diode LD group #2 emit light concurrently as three pulses. In the period U-3 from time m to time o, the laser diodes LD31 to LD34 included in the laser diode LD group #3 emit light concurrently as three pulses. The light emission duration per pulse in the period U-3 is set longer than in the periods U-1 and U-2. In the period U-4 from time o to time r, the laser diodes LD41 to LD44 included in the laser diode LD group #4 emit light concurrently as five pulses. The light emission duration per pulse in the period U-4 is set shorter than in the periods U-1 and U-2.

In the foregoing description, a plurality of light pulses are emitted in the periods U. Alternatively, a single light pulse may be emitted. In the periods U, furthermore, if the turn-on signal φ1 is kept at "H (0 V)", the voltage across a series connection of the setting thyristors S and the laser diodes LD is kept at 0 V. Consequently, the laser diodes LD do not emit light. That is, the laser diodes LD may be kept unlit in a predetermined period U.

As described above, allowing the plurality of laser diodes LD included in each of the laser diode LD groups to emit light concurrently prevents deterioration of the light emission characteristics of the laser diodes LD such as impairment of the uniformity of light emission, distortion of the light-emission profiles, and the increase in divergence angle, which may be caused by increasing the sizes of the light-emitting points to increase optical output.

FIGS. 9A to 9C illustrate arrangements of laser diodes LD included in each laser diode LD group. FIG. 9A illustrates a y-direction arrangement of the laser diodes LD, FIG. 9B illustrates a diagonal arrangement of the laser diodes LD relative to the x direction and the y direction, and FIG. 9C illustrates a triangular arrangement of the laser diodes LD. In FIGS. 9A to 9C, the x direction and the y direction are defined in the same way as that in FIG. 2.

FIGS. 9A to 9C illustrate the laser diode LD group #1 including the laser diode LD11/setting thyristor S11 (LD/S11), the laser diode LD12/setting thyristor S12 (LD/S12), and the laser diode LD13/setting thyristor S13 (LD/S13), by way of example. The other laser diode groups may be arranged in parallel with the laser diode LD group #1. Alternatively, the laser diodes LD included in each of the laser diode LD groups may be arranged in a different way.

Second Exemplary Embodiment

Light-Emitting Device 10

In the light-emitting device 10 according to the first exemplary embodiment, as illustrated in FIGS. 3 and 4, the setting thyristor S and the laser diode LD are stacked on the substrate 80 in this order, from bottom to top, starting with the substrate 80. In the light-emitting device 10 according to a second exemplary embodiment, the laser diode LD and the setting thyristor S are stacked on the substrate 80 in this order, from bottom to top, starting with the substrate 80.

Figure 10:
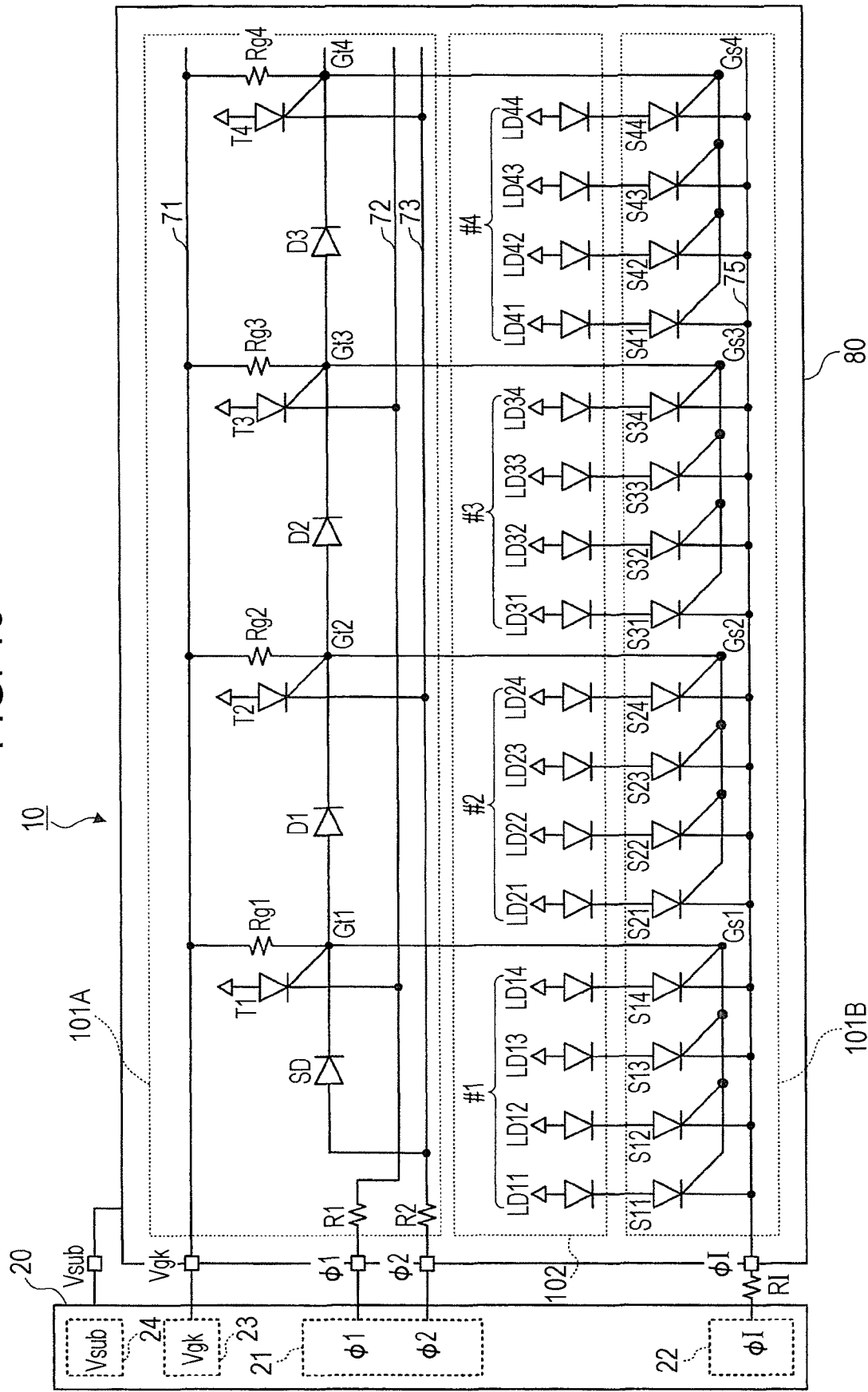
FIG. 10 is an equivalent circuit diagram of a light-emitting device according to a second exemplary embodiment.

FIG. 10 is an equivalent circuit diagram of the light-emitting device 10 according to the second exemplary embodiment. The setting thyristor S and the laser diode LD are connected in reverse order to that in the light-emitting device 10 according to the first exemplary embodiment illustrated in FIG. 1. That is, the anodes of the laser diodes LD are connected to the reference potential, and the cathodes of the laser diodes LD are connected to the anodes of the setting thyristors S. The cathodes of the setting thyristors S are connected to the turn-on signal line 75. The other configuration is similar to that in the first exemplary embodiment and will not be described herein. The transfer unit 101 is divided into a transfer unit 101A including the transfer thyristors T, the coupling diodes D, the power supply line resistors Rg, the start diode SD, and the current-limit resistors R1 and R2, and a transfer unit 101B including the setting thyristors S.

Plan View Layout of Light-Emitting Device 10

Figure 11:
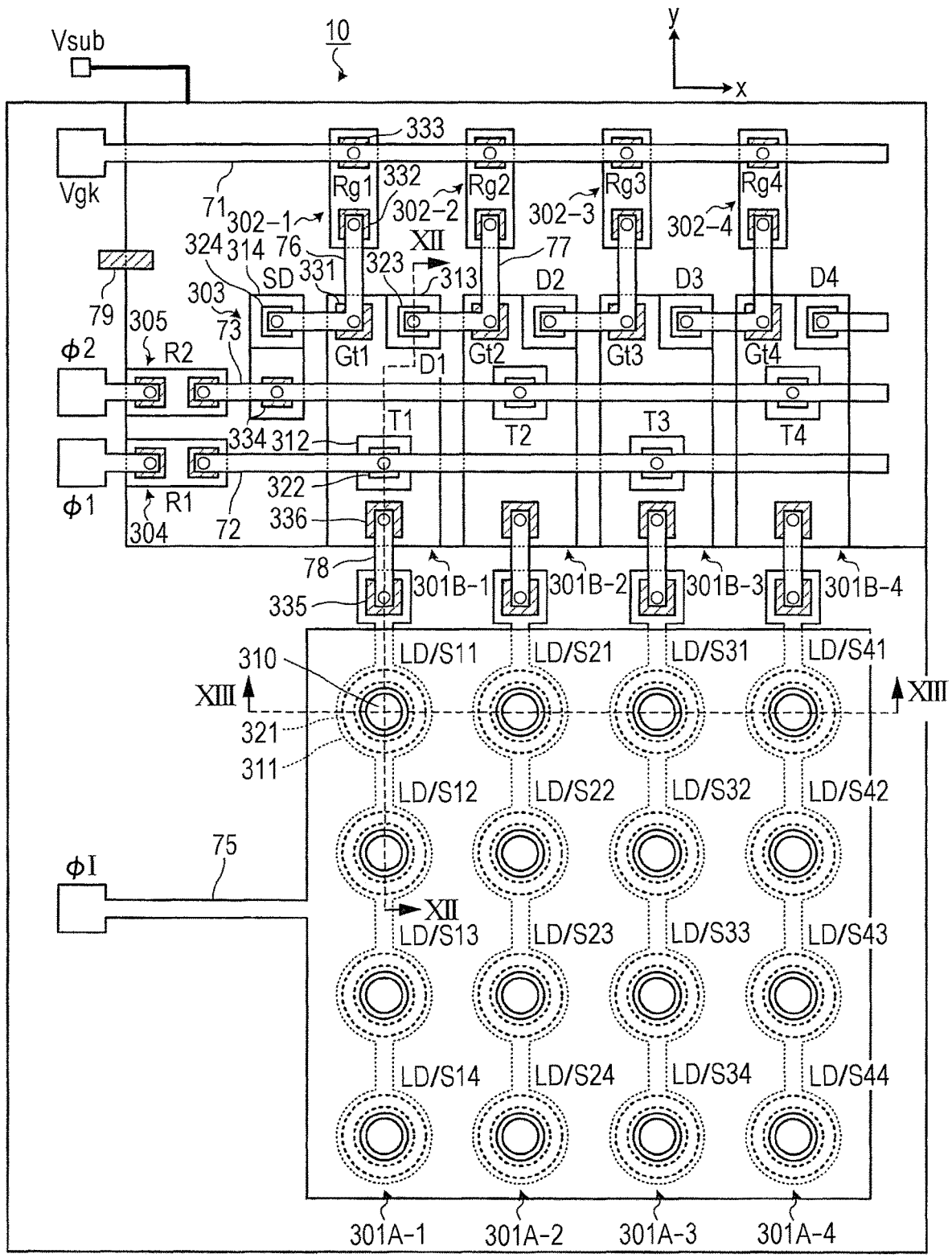
FIG. 11 illustrates an example of a plan view layout of the light-emitting device according to the second exemplary embodiment.

FIG. 11 illustrates an example of a plan view layout of the light-emitting device 10 according to the second exemplary embodiment. In FIG. 11, a direction extending rightward is defined as the x direction, and a direction extending upward is defined as the y direction. The x direction is the same direction as the x direction in FIG. 1.

The following mainly describes a difference from the plan view layout of the light-emitting device 10 according to the first exemplary embodiment illustrated in FIG. 2.

In the light-emitting device 10 according to the second exemplary embodiment, as illustrated in FIG. 11, the islands 301 according to the first exemplary embodiment illustrated in FIG. 2 are separated into islands 301A where the laser diode LD groups are disposed and islands 301B where the transfer thyristors T and the coupling diodes D are disposed. The islands 301A are arrays of posts 311, each of which is formed into a cylindrical shape in accordance with the outer appearance of the laser diode LD. Each of the posts 311 is formed by stacking the laser diode LD and the setting thyristor S on top of each other.

The posts 311 included in the laser diode LD groups are configured such that portions of opposing posts 311 are continuous with each other in the y direction.

Cross-Sectional Structure of Light-Emitting Device 10

Figure 12:
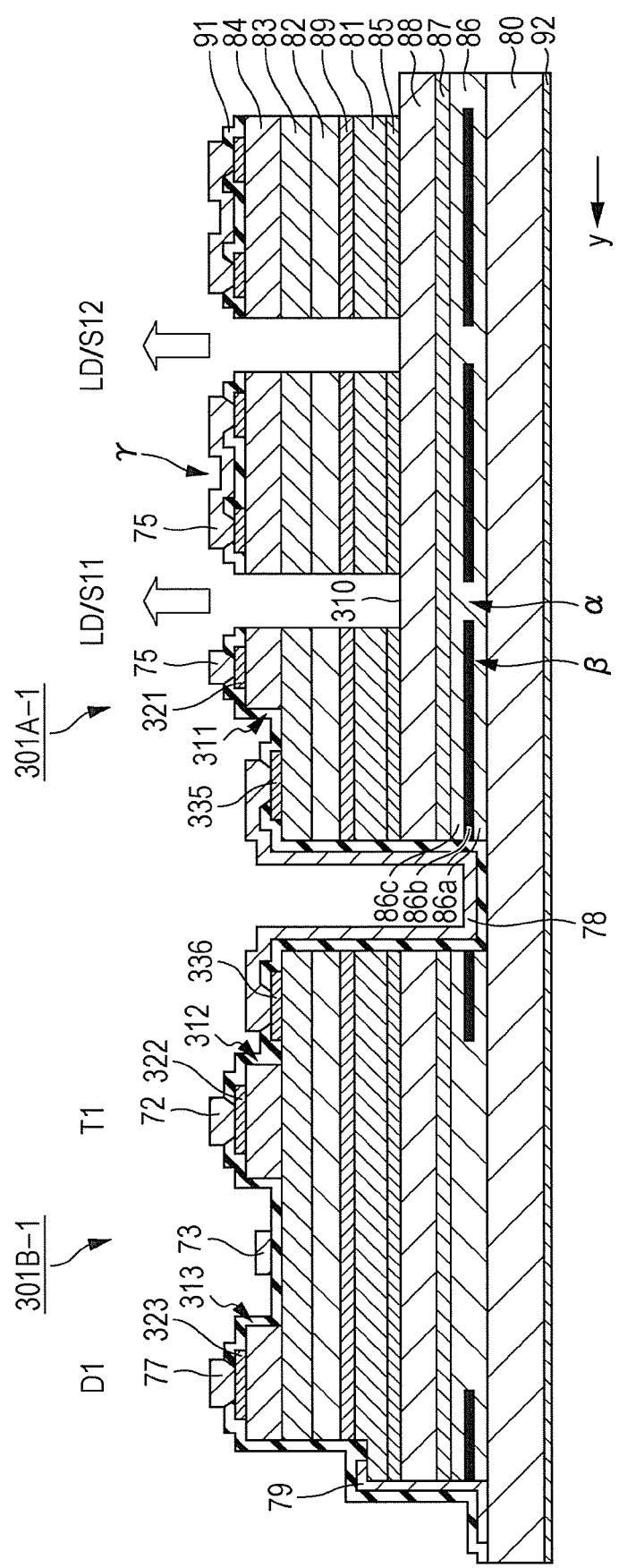
FIG. 12 is a cross-sectional view of the light-emitting device, taken along line XII-XII of FIG. 11.

FIG. 12 is a cross-sectional view of the light-emitting device 10, taken along line XII-XII of FIG. 11. In FIG. 12, a direction extending leftward is defined as the y direction. That is, the cross-sectional view illustrated in FIG. 12 is a cross-sectional view of the islands 301B-1 and 301A-1. In FIG. 12, the coupling diode D1, the transfer thyristor T1, the laser diode LD11/setting thyristor S11 (LD/S11), and the laser diode LD12/setting thyristor S12 (LD/S12) are illustrated from the left to the right. The laser diode LD13/setting thyristor S13 (LD/S13) and the laser diode LD14/setting thyristor S14 (LD/S14) are disposed to the right of the laser diode LD12/setting thyristor S12 (LD/S12), which are not illustrated in FIG. 12.

First, the island 301A-1 in which the setting thyristor S and the laser diode LD are stacked on top of each other will be described. As illustrated in FIG. 12, conversely to FIG. 3, on the p-type GaAs substrate 80, layers forming the laser diode LD are stacked on top of each other, which include the p-anode layer 86, the light-emitting layer 87, and the n-cathode layer 88.

On top of the n-cathode layer 88, the tunnel junction layer 85 is stacked.

Further, layers forming the setting thyristor S are stacked on top of each other, which include the p-anode layer 81, the voltage reduction layer 89, the n-gate layer 82, the p-gate layer 83, and the n-cathode layer 84.

In a center portion of the post 311, the n-cathode layer 84, the p-gate layer 83, the n-gate layer 82, the voltage reduction layer 89, the p-anode layer 81, and the tunnel junction layer 85 are removed by etching so that the n-cathode layer 88 is exposed. Consequently, the n-cathode layer 88 of the laser diode LD is exposed. The exposed portion of the n-cathode layer 88 serves as the light exit opening 310 in the laser diode LD.

That is, the post 311 is configured such that the tunnel junction layer 85, the p-anode layer 81, the voltage reduction layer 89, the n-gate layer 82, the p-gate layer 83, and the n-cathode layer 84 are left to form the setting thyristor S in such a manner as to surround the light exit opening 310 in the laser diode LD. As illustrated in FIG. 11, a multi-layer semiconductor body is provided so that portions of the posts 311 are continuous with one another in plan view.

With this configuration, when the current constriction layer 86b included in the p-anode layer 86 is oxidized from the circumferential portion of the post 311 formed into a cylindrical shape, oxidation progresses from the circumferential portion toward the center portion. Consequently, a current-passing area α having a circular cross section is formed.

In the post 311, the n-ohmic electrode 321, which is the cathode electrode, is disposed on top of the n-cathode layer 84. The n-ohmic electrode 321 is connected to the turn-on signal line 75 via a through-hole formed in the interlayer insulating layer 91.

Furthermore, a multi-layer semiconductor body is provided so that portions of the posts 311 are continuous with one another in plan view. This configuration allows the n-gate layers 82 and the p-gate layers 83 of all the setting thyristors S included in the laser diode LD group to be connected, which eliminates a need to dispose a line for each of the laser diodes LD to control the setting thyristor S. The portions of the posts 311 that are continuous with one another (indicated by y) may be connected in either the p-gate layer 83 or the n-gate layer 82. In an anode-grounded configuration illustrated in FIG. 12, the portions may be connected in the n-gate layer 82.

The multi-layer semiconductor body provided so that portions of the posts 311 are continuous with one another may have a width that allows the current-passing area α to be formed so that the light emission characteristics of the laser diodes LD do not deteriorate when the current constriction layer 86b is oxidized.

In FIG. 12, the island 301A-1 is provided with, at the left edge thereof, a p-ohmic electrode 335 on the p-gate layer 83 that is exposed by removing the n-cathode layer 84. The p-ohmic electrode 335 is connected to a line 78 via a through-hole formed in the interlayer insulating layer 91.

Next, the island 301B-1 will be described.

The island 301B-1 is provided with a p-ohmic electrode 336 over the p-gate layer 83, which is exposed in a portion facing the island 301A-1. The p-ohmic electrode 336 is connected to the line 78 via a through-hole formed in the interlayer insulating layer 91. With this configuration, when the transfer thyristor T1 is turned on and the gate Gt1 becomes equal to 0 V, the gate Gs of the setting thyristors S in the island 301A-1 becomes equal to 0 V via the line 78. That is, the on-state of the transfer thyristor T1 is transmitted to the setting thyristors S.

In the island 301B-1, as illustrated in a left portion of FIG. 12, the p-anode layer 81 is exposed. The exposed p-anode layer 81 and the substrate 80 are connected via a line 79. The line 79 may be formed of the same material as that of the p-ohmic electrode 331 and the like.

The islands 301B-1, 301B-2, 301B-3, . . . , 302, 303, 304, and 305 may be formed by etching the layers up to the p-anode layer 81 and connecting the exposed p-anode layer 81 to the substrate 80 using the line 79. This configuration eliminates a need to dispose a line for each island (the islands 301B-1, 301B-2, 301B-3, . . . , 302, 303, 304, and 305) (see FIG. 11).

Figure 13:
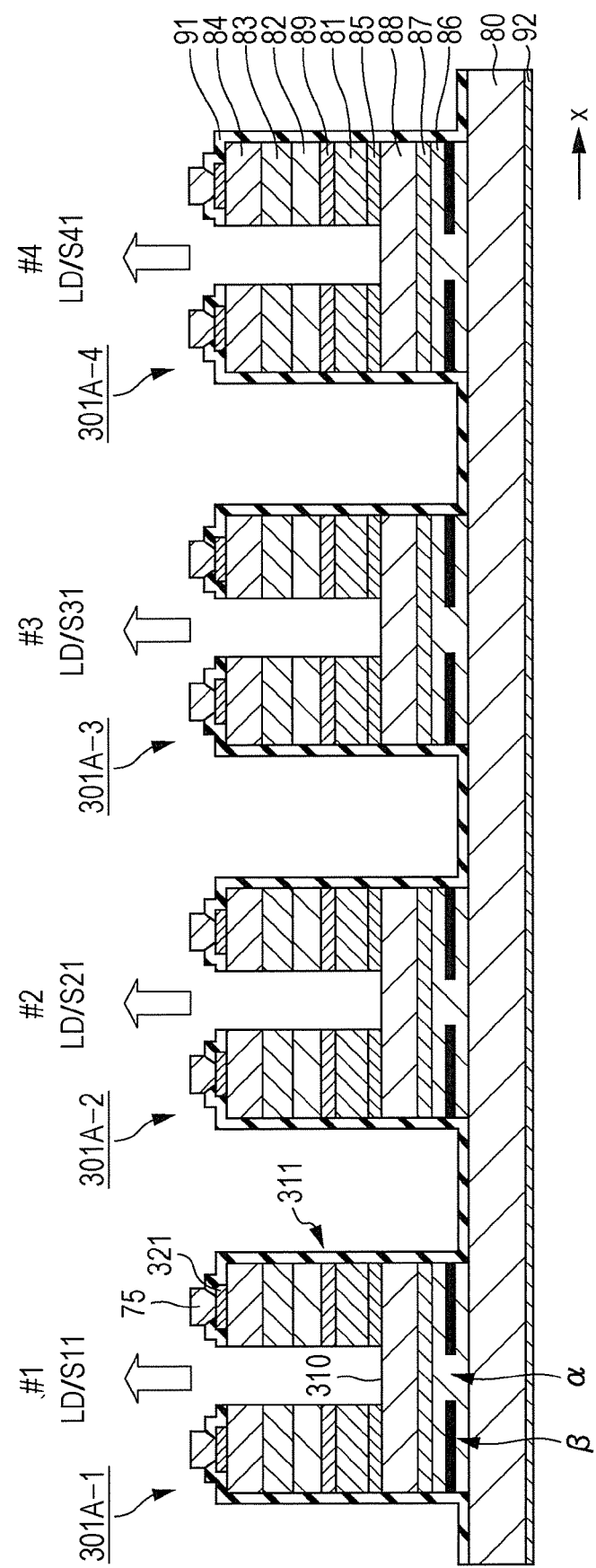
FIG. 13 is a cross-sectional view of the light-emitting device, taken along line XIII-XIII of FIG. 11.

FIG. 13 is a cross-sectional view of the light-emitting device 10, taken along line XIII-XIII of FIG. 11. In FIG. 13, a direction extending rightward is defined as the x direction. That is, the cross-sectional view illustrated in FIG. 13 is a cross-sectional view of the islands 301A-1, 301A-2, 301A-3, and 301A-4. In the island 301A-1, the laser diode LD11/setting thyristor S11 (LD/S11) included in the laser diode LD group #1 are illustrated. In the island 301A-2, the laser diode LD21/setting thyristor S21 (LD/S21) included in the laser diode LD group #2 are illustrated. In the island 301A-3, the laser diode LD31/setting thyristor S31 (LD/S31) included in the laser diode LD group #3 are illustrated. In the island 301A-4, the laser diode LD41/setting thyristor S41 (LD/S41) included in the laser diode LD group #4 are illustrated.

As illustrated in FIG. 13, in the cross section taken along line XIII-XIII of FIG. 11, around the islands 301A, the n-cathode layer 84, the p-gate layer 83, the n-gate layer 82, the voltage reduction layer 89, the p-anode layer 81, the tunnel junction layer 85, the n-cathode layer 88, the light-emitting layer 87, and the p-anode layer 86 are removed up to the substrate 80. With this configuration, the laser diodes LD are separated in the islands 301A, 301B, and so on.

The material of the voltage reduction layer 89 is more difficult to grow and is lower in quality than GaAs, InP, and the like. Thus, a defect is more likely to occur in the voltage reduction layer 89, and the defect is extended in a semiconductor grown on the voltage reduction layer 89, such as GaAs.

The light emission characteristics of light-emitting elements such as the laser diodes LD are likely to be affected by a defect included in the semiconductor layers. In contrast, it is desirable that the thyristors (the setting thyristors S and the transfer thyristors T) be turned on to supply current to the laser diodes LD. Thus, if thyristors including the voltage reduction layer 89 are not used as a light-emitting layer, but are used to reduce voltage, a semiconductor layer of the thyristors may include a defect.

In the second exemplary embodiment, accordingly, the laser diodes LD are disposed on top of the substrate 80, and the transfer thyristors T and the setting thyristors S, which include the voltage reduction layer 89, are disposed on top of the laser diodes LD. This configuration may prevent the generation of a defect in the laser diodes LD, and the light emission characteristics are less likely to be affected by any defect. In addition, the transfer thyristors T and the setting thyristors S may be monolithically stacked.

In portions where the transfer thyristors T are disposed on top of the semiconductor layers forming the laser diodes LD (the p-anode layer 86, the light-emitting layer 87, and the n-cathode layer 88), the p-anode layer 86, the light-emitting layer 87, and the n-cathode layer 88 are short-circuited by the line 79 so as not to activate the laser diodes LD.

The other configuration, production method, and operation of the light-emitting device 10 according to the second exemplary embodiment are similar to those according to the first exemplary embodiment and will not be described herein.

Third Exemplary Embodiment

An optical apparatus 30 according to a third exemplary embodiment includes the light-emitting device 10 described above in the first exemplary embodiment and the second exemplary embodiment.

Optical Apparatus 30

Figure 14:
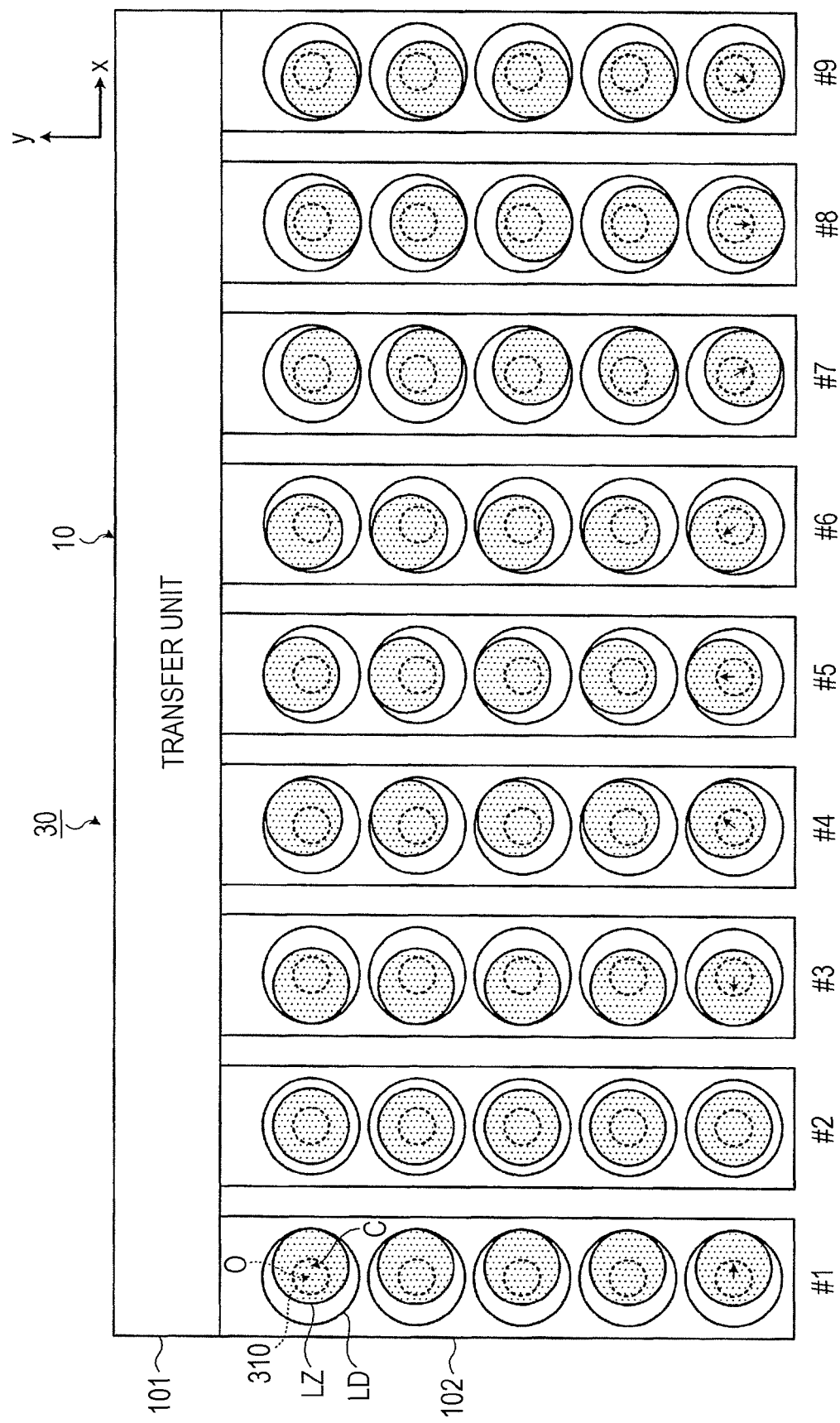
FIG. 14 illustrates an optical apparatus according to a third exemplary embodiment.

FIG. 14 illustrates the optical apparatus 30 according to the third exemplary embodiment. In FIG. 14, a direction extending rightward is defined as the x direction, and a direction extending upward is defined as the y direction.

The optical apparatus 30 includes the light-emitting device 10 and an optical element. The light-emitting device 10 includes a light-emitting unit 102, and the light-emitting unit 102 includes nine laser diode LD groups (laser diode LD groups #1 to #9) arranged one-dimensionally in the x direction. The details of the transfer unit 101 are not illustrated. The laser diodes LD included in each of the laser diode LD groups each include an optical element that changes the direction or divergence angle of light emitted from the associated laser diode LD. In the following, by way of example, each optical element is described as a convex lens (hereinafter referred to as lens LZ) configured to deflect the light emission direction to a predetermined direction. For example, as illustrated in FIG. 14, in the laser diode LD group #1, each of the lenses LZ is arranged in such a manner that the center C of the lens LZ is shifted from the center O of the light exit opening 310 in the laser diode LD in the x direction so that light emitted from the laser diode LD can be deflected in the x direction. The directions of arrows illustrated in the bottom row in FIG. 14 indicate the directions in which the centers C of the lenses LZ are shifted from the centers O of the light exit openings 310 in the laser diodes LD.

In the laser diode LD group #2, each of the lenses LZ is arranged in such a manner that the center C of the lens LZ coincides with the center O of the light exit opening 310 in the laser diode LD so that light emitted from the laser diode LD is not deflected. In the laser diode LD group #3, conversely to the laser diode LD group #1, each of the lenses LZ is arranged in such a manner that the center C of the lens LZ is shifted from the center O of the light exit opening 310 in the negative (−) x direction so that light emitted from the laser diode LD can be deflected in the negative (−) x direction. Likewise, each of the lenses LZ in the laser diode LD group #4 is arranged to provide the deflection of the light beam in the x direction and the y direction; each of the lenses LZ in the laser diode LD group #5 is arranged to provide the deflection of the light beam in the y direction; each of the lenses LZ in the laser diode LD group #6 is arranged to provide the deflection of the light beam in the negative (−) x direction and the y direction; each of the lenses LZ in the laser diode LD group #7 is arranged to provide the deflection of the light beam in the x direction and the negative (−) y direction; each of the lenses LZ in the laser diode LD group #8 is arranged to provide the deflection of the light beam in the negative (−) y direction; and each of the lenses LZ in the laser diode LD group #9 is arranged to provide the deflection of the light beam in the negative (−) x direction and the negative (−) y direction.

When the lenses LZ are small lenses such as microlens, the angles of deflection may be small. In this case, another lens may be disposed in front of the optical apparatus 30 including the lenses LZ to increase the angles of deflection. While the lenses LZ are described as convex lenses, the lenses LZ may be concave lenses or aspheric lenses.

In the foregoing description, the light emission direction is deflected. Alternatively, the divergence angle may be changed. For example, a convex lens may be used to make the light beam converge on an irradiated surface or make the light beam diverge such that light can be applied to a predetermined area on the irradiated surface.

Optical Measurement Apparatus 1

Figure 15:
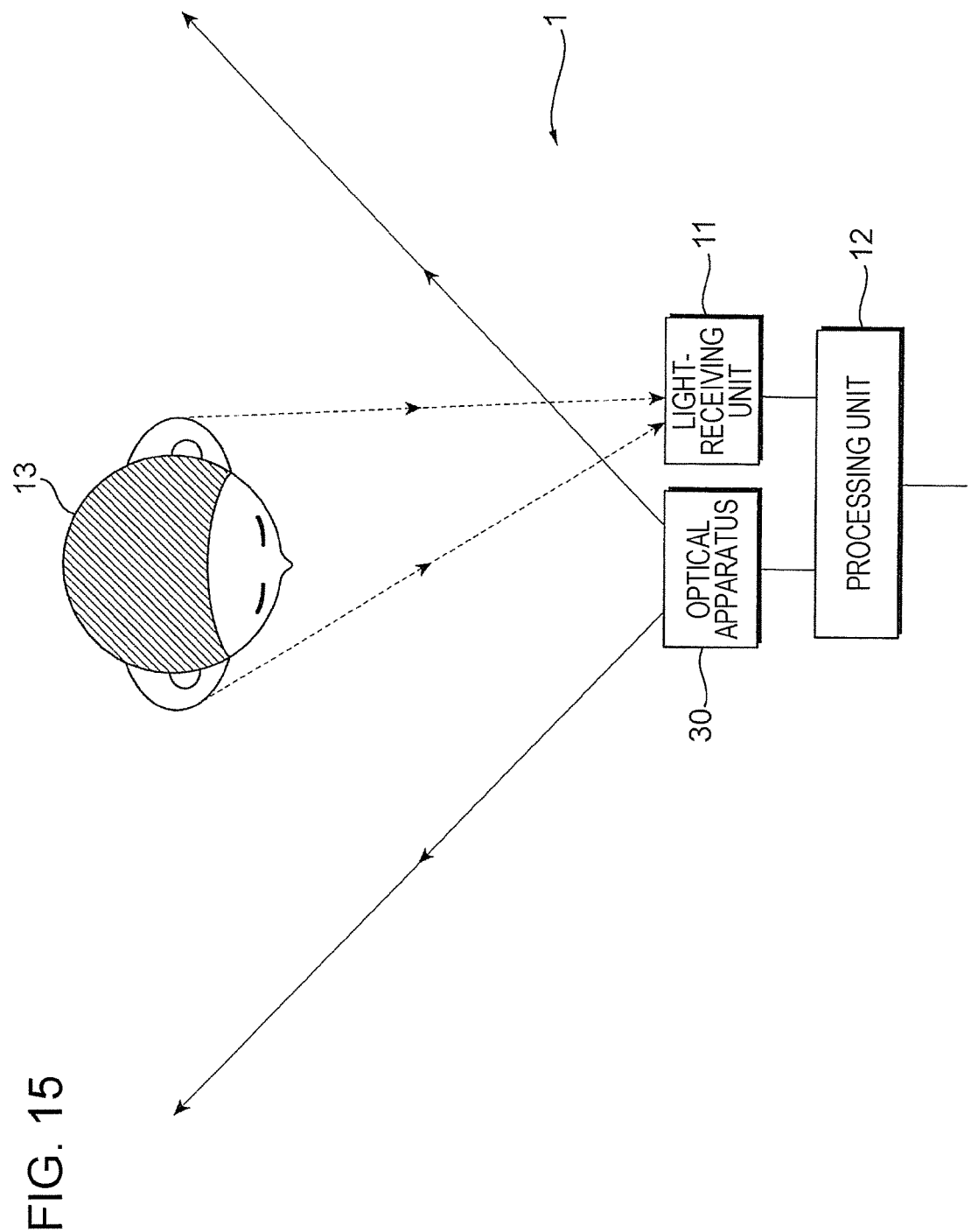
FIG. 15 illustrates an optical measurement apparatus including the optical apparatus.

FIG. 15 illustrates an optical measurement apparatus 1 including the optical apparatus 30. The optical measurement apparatus 1 includes the optical apparatus 30, a light-receiving unit 11 that receives light, and a processing unit 12 that processes data. A measurement object (object) 13 moves close to the optical measurement apparatus 1. The measurement object 13 is a person, for example, who is viewed from above in FIG. 15.

The light-receiving unit 11 is a device that receives light reflected from the measurement object 13. The light-receiving unit 11 may be a photodiode. The photodiode is, for example, a single photon avalanche diode (SPAD) that enables accurate measurement of the light receiving time.

The processing unit 12 is configured as a computer including an input/output unit that receives and outputs data. The processing unit 12 processes information concerning light to calculate the distance to the measurement object 13 or calculate the two-dimensional or three-dimensional shape of the measurement object 13.

The processing unit 12 of the optical measurement apparatus 1 controls the light-emitting device 10 of the optical apparatus 30 to emit light from the light-emitting device 10. That is, the light-emitting device 10 of the optical apparatus 30 emits light in a pulsed manner. The processing unit 12 determines a time difference between the time at which the light-emitting device 10 emits light and the time at which the light-receiving unit 11 receives light reflected from the measurement object 13 to calculate, based on the time difference, the length of the path of light emitted from the optical apparatus 30 and reaching the light-receiving unit 11 after being reflected from the measurement object 13. Accordingly, the processing unit 12 measures the distance to the measurement object 13 from the optical apparatus 30 or the light-receiving unit 11 or the distance to the measurement object 13 from a point used as a reference (hereinafter referred to as reference point). The reference point is a point at a position a predetermined distance away from the optical apparatus 30 and the light-receiving unit 11.

Figure 16:
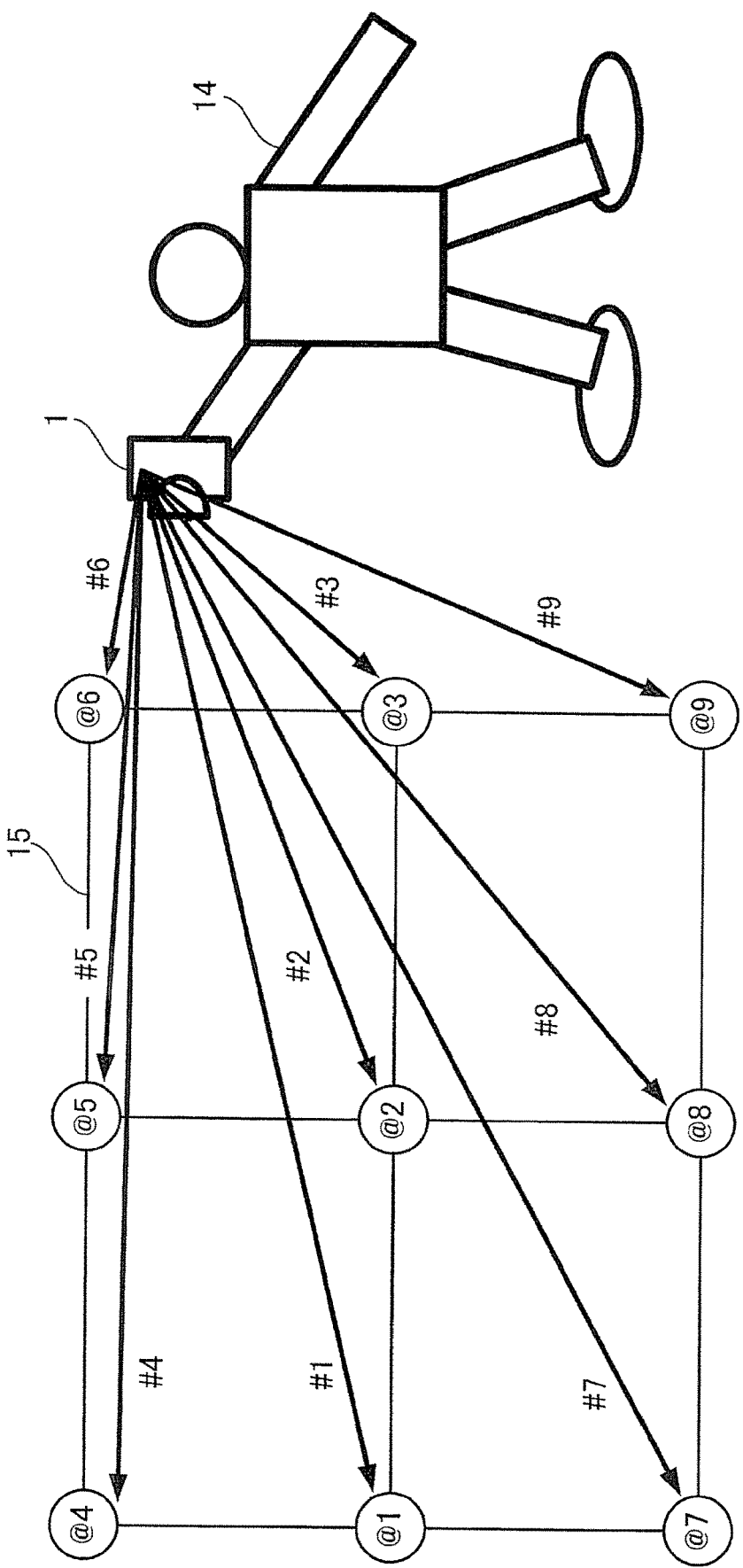
FIG. 16 illustrates how light beams are emitted from the optical measurement apparatus.

FIG. 16 illustrates how light beams are emitted from the optical measurement apparatus 1. In the illustrated example, the presence of an object ahead of a person 14 is detected by the optical measurement apparatus 1 that the person 14 is holding in their right hand.

As described above, light beams from the laser diode LD group #1 of the light-emitting device 10 in the optical apparatus 30 are directed toward an area @1 on a virtually set irradiated surface 15. Also, light beams from the laser diode LD group #2 are directed toward an area @2. That light beams are sequentially emitted from the laser diode LD groups #1 to #9 to different areas @1 to @9. The light-receiving unit 11 receives reflected light beams. The processing unit 12 measures the time taken from emission of a light beam to reception of the reflected light beam by the light-receiving unit 11. Accordingly, the person 14 is able to know in which direction the measurement object 13 is located. That is, the optical measurement apparatus 1 serves as a proximity sensor. Additionally, based on the distance to the measurement object 13, the two-dimensional or three-dimensional shape of the measurement object 13 is measured.

The method described above is a measurement method based on the arrival time of light, called a time-of-flight (TOF) method. In this method, it is desirable to radiate pulsed light a plurality of times to enhance measurement accuracy. Accordingly, as illustrated in the time chart in FIG. 8, it is desirable to irradiate pulsed light a plurality of times in each of the periods U during which the predetermined laser diode LD groups in the light-emitting device 10 are caused to emit light. In addition, the number of pulses to be emitted in a specific direction, for example, the area @2 in front of the person 14 in FIG. 16, may be increased to increase measurement accuracy. That is, the period U during which the area @2 is irradiated with light may be made longer than the other periods U to increase the number of pulses.

The optical apparatus 30 is configured to sequentially emit light beams in a predetermined direction. This configuration allows the optical apparatus 30 to consume less power than a configuration for simultaneously emitting light beams in many directions, although the optical apparatus 30 has lower resolution. To simultaneously emit light beams in many directions, two-dimensionally arranged light-receiving elements are used to identify the direction in which the reflected light beams come. Compared to this configuration, the optical measurement apparatus 1, which is configured to sequentially emit light beams in changing directions, does not require two-dimensionally arranged light-receiving elements. It is only required to use light-receiving elements capable of quickly measuring changes in the intensity of received light. Thus, the optical measurement apparatus 1 has a simple configuration.

The light-emitting device 10 in the optical apparatus 30 illustrated in FIG. 14 includes the nine laser diode LD groups #1 to #9. As illustrated in FIG. 16, the 3×3, nine areas @1 to @9 are irradiated with light. To increase the number of areas, the number of laser diode LD groups that are arranged may be changed. To irradiate 5×5, 25 areas @1 to @25 with light, 25 laser diode LD groups may be used. Alternatively, 5×4 or 4×5, 20 areas may be used. While the laser diode LD groups are arranged one-dimensionally, the laser diode LD groups may be arranged two-dimensionally. The areas to be irradiated with light may not necessarily be arranged in a lattice. Optical elements such as the lenses LZ may be set so as to set the directions in which light beams are emitted from the laser diodes LD of the light-emitting device 10 in the optical apparatus 30 to apply the light beams to the locations to be measured.

Image Forming Apparatus 2

The optical apparatus 30 described above may be used in an image forming apparatus that forms an image.

Figure 17:
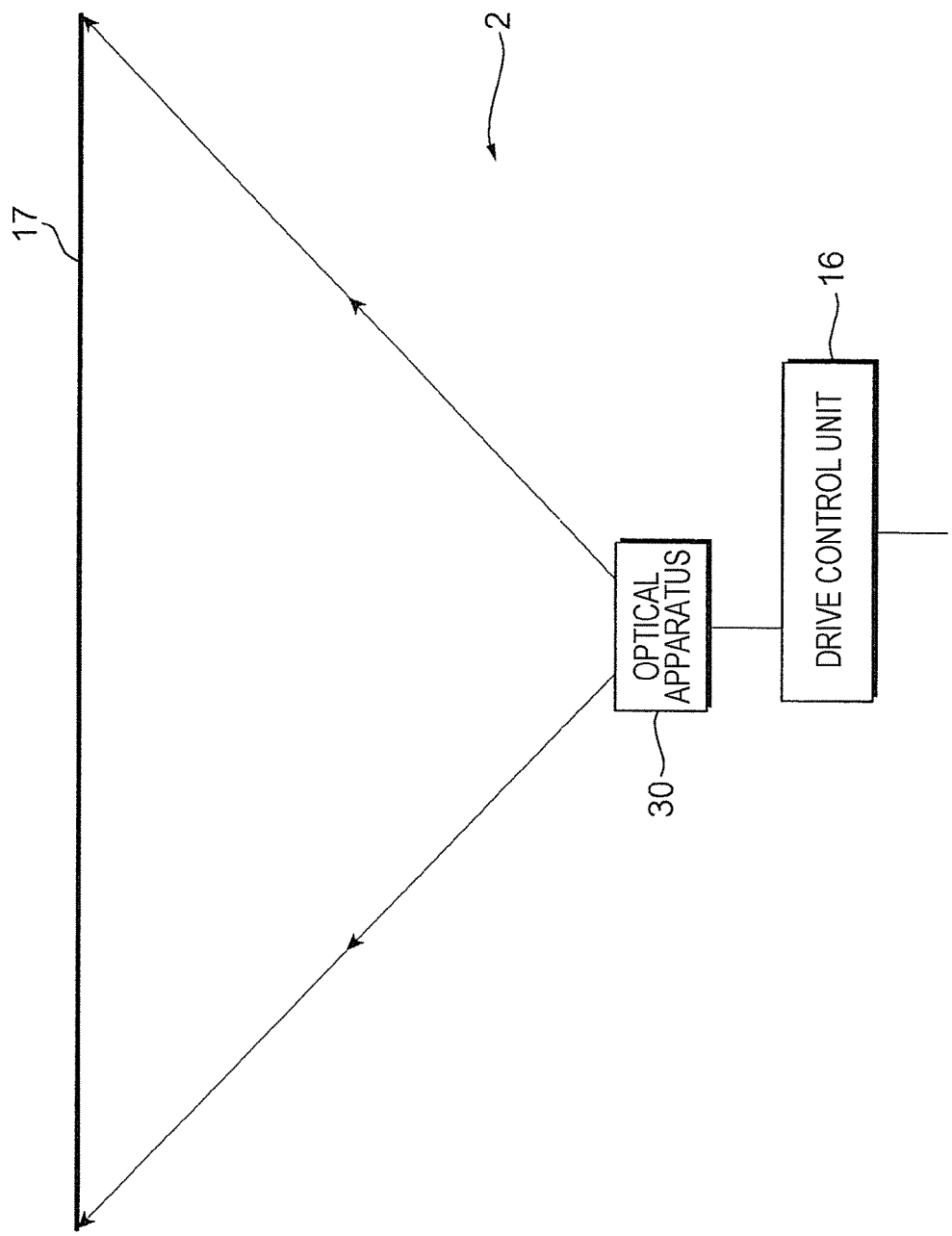
FIG. 17 illustrates an image forming apparatus including the optical apparatus.

FIG. 17 illustrates an image forming apparatus 2 including the optical apparatus 30.

The image forming apparatus 2 includes the optical apparatus 30, a drive control unit 16, and a screen 17 that receives light.

The operation of the image forming apparatus 2 will be described.

As described above, the light-emitting device 10 in the optical apparatus 30 causes the laser diode LD groups to sequentially emit light. Thus, the optical apparatus 30 applies light two-dimensionally. The emission or non-emission of light and the light emission duration are controlled by the turn-on signal ϕI. The drive control unit 16 receives an image signal, controls, based on the image signal, the emission or non-emission of light from the light-emitting device 10 to form a two-dimensional image, and drives the optical apparatus 30. Accordingly, a two-dimensional image is obtained. The obtained two-dimensional still image or moving image is projected onto the screen 17.

That is, the optical apparatus 30 described in the third exemplary embodiment sequentially drives the laser diode LD groups in the light-emitting device 10 along the array to apply light over a surface. That is, a one-dimensional operation is performed to apply light two-dimensionally.

In the light-emitting device 10 in the optical apparatus 30 according to the third exemplary embodiment, each of the laser diode LD groups, which are an example of light-emitting element groups, includes the laser diodes LD, which are an example of a plurality of light-emitting elements. Alternatively, each light-emitting element group may include a single light-emitting element. That is, the light-emitting device 10 may be configured to sequentially control the emission or non-emission of light from the single light-emitting elements.

The laser diodes LD are controlled in terms of emission or non-emission of light. Alternatively, the light emission intensity in the light-emitting state may be increased.

In the light-emitting device 10 according to the first to third exemplary embodiments, the transfer unit 101, such as the transfer thyristors T, is used to sequentially control the emission or non-emission of light from the laser diode LD groups, which are an example of light-emitting element groups. Alternatively, any other method may be used to sequentially control the emission or non-emission of light from the laser diode LD groups, which are an example of light-emitting element groups.

In the exemplary embodiments described above, the light-emitting device 10 has an anode-grounded configuration in which anodes are set at reference potential. Alternatively, a cathode-grounded configuration in which cathodes are set at reference potential may be used.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed:

1. A light-emitting device comprising
    a light-emitting unit including an array of a plurality of light-emitting element groups, each including a plurality of light-emitting elements,
    wherein in the light-emitting unit, the plurality of light-emitting element groups are sequentially driven along the array such that, for each of the plurality of light-emitting element groups, the plurality of light-emitting elements included in the light-emitting element group are concurrently set to a state of emitting light or a state of not emitting light, wherein the plurality of light-emitting elements included in the plurality of light-emitting element groups are connected to setting elements, each of the setting elements being connected to a corresponding one of the plurality of light-emitting elements and being turned on to set the corresponding one of the plurality of light-emitting elements to be capable of emitting light or emitting light of increased intensity.

2. The light-emitting device according to claim 1, wherein the setting elements comprise thyristors including an anode layer, a first gate layer, a second gate layer, and a cathode layer, and wherein the setting elements connected to the plurality of light-emitting elements included in each of the plurality of light-emitting element groups are configured such that at least one of the first gate layer or the second gate layer is continuous across the plurality of light-emitting elements.

3. The light-emitting device according to claim 1, further comprising a turn-on signal line disposed in common to the plurality of light-emitting element groups, wherein the plurality of light-emitting elements in each of the plurality of light-emitting element groups, which are set by the corresponding ones of the setting elements to be capable of emitting light or emitting light of increased intensity, are caused to continuously or intermittently emit light or emit light of increased intensity by a turn-on signal supplied through the turn-on signal line.

4. The light-emitting device according to claim 1, wherein each of the plurality of light-emitting elements and the corresponding one of the setting elements are stacked on top of each other with a tunnel junction therebetween.

5. The light-emitting device according to claim 2, wherein each of the plurality of light-emitting elements and the corresponding one of the setting elements are stacked on top of each other with a tunnel junction therebetween.

6. The light-emitting device according to claim 1, further comprising a transfer unit that sequentially sets the plurality of light-emitting element groups to a turn-on state or a turn-off state one after another such that the plurality of light-emitting elements in each of the plurality of light-emitting element groups are set to the turn-on state or the turn-off state.

7. The light-emitting device according to claim 6, wherein the transfer unit includes a plurality of transfer elements, each disposed for a corresponding one of the plurality of light-emitting element groups, and wherein the plurality of transfer elements are sequentially turned on one after another to set the plurality of light-emitting elements in the corresponding one of the plurality of light-emitting element groups that is connected to a turned-on transfer element among the plurality of transfer elements to be capable of emitting light or emitting light of increased intensity.

8. An optical apparatus comprising:

the light-emitting device according to claim 1; and an optical element that sets directions or divergence angles of light beams emitted from the plurality of light-emitting element groups included in the light-emitting device to a predetermined direction or a predetermined divergence angle.

9. The optical apparatus according to claim 8, wherein the optical element sets the directions or divergence angles of the light beams emitted from the plurality of light-emitting element groups to be different from each other.

10. An optical measurement apparatus comprising:

the optical apparatus according to claim 9;

a light-receiving unit that receives light reflected from an object irradiated with light from the optical apparatus; and a processing unit that processes information concerning the light received by the light-receiving unit to measure a distance from the optical apparatus to the object or measure a shape of the object.

11. An image forming apparatus comprising:

the optical apparatus according to claim 8; and a drive control unit that receives an image signal and drives the optical apparatus, based on the image signal, to form a two-dimensional image using light emitted from the optical apparatus.

12. The light-emitting device according to claim 1, wherein the plurality of light-emitting elements are formed on a same substrate.

13. The light-emitting device according to claim 1, wherein the light-emitting device is monolithically stacked.

* * * * *